(12) United States Patent
Kida

(10) Patent No.: US 10,149,382 B2
(45) Date of Patent: Dec. 4, 2018

(54) WIRING SUBSTRATE, WIRING MEMBER, LIQUID DISCHARGE HEAD, LIQUID DISCHARGE DEVICE, AND LIQUID DISCHARGE APPARATUS

(71) Applicant: Hitoshi Kida, Kanagawa (JP)

(72) Inventor: Hitoshi Kida, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 15/805,480

(22) Filed: Nov. 7, 2017

(65) Prior Publication Data
US 2018/0146551 A1    May 24, 2018

(30) Foreign Application Priority Data

Nov. 18, 2016  (JP) ................................. 2016-225508
Sep. 13, 2017  (JP) ................................. 2017-175812

(51) Int. Cl.
*B41J 2/14*    (2006.01)
*H05K 1/11*    (2006.01)
(Continued)

(52) U.S. Cl.
CPC ............ *H05K 1/11* (2013.01); *B41J 2/14201* (2013.01); *B41J 2/14233* (2013.01); *H05K 1/118* (2013.01); *H05K 1/14* (2013.01); *H05K 3/361* (2013.01); *B41J 2002/14241* (2013.01); *B41J 2002/14419* (2013.01);
(Continued)

(58) Field of Classification Search
CPC ............. B41J 2/04541; B41J 2/14072; B41J 2/14201; B41J 2/14233; B41J 2002/14491; B41J 2002/18; H01L 2924/19107; H05K 1/11; H05K 1/14; H05K 1/118; H05K 3/361
See application file for complete search history.

(56) References Cited

U.S. PATENT DOCUMENTS 6,471,342 B1 * 10/2002 Horio ..................... B41J 2/14
                                                     347/70
7,316,939 B2 *  1/2008 Saimen ............. H01L 21/67092
                                                     257/668
(Continued)

FOREIGN PATENT DOCUMENTS

| JP | 2002-026477 | 1/2002 |
| JP | 2006-013230 | 1/2006 |
| JP | 2006-210855 | 8/2006 |
| JP | 2007-207618 | 8/2007 |
| JP | 2007-299701 | 11/2007 |
| JP | 2008-146944 | 6/2008 |
| JP | 2016-134453 | 7/2016 |

*Primary Examiner* — Anh T. N. Vo
(74) *Attorney, Agent, or Firm* — Oblon, McClelland, Maier & Neustadt, L.L.P.

(57) ABSTRACT

A wiring substrate includes a plurality of wiring patterns, a protective layer to cover the plurality of wiring patterns and regions between the plurality of wiring patterns, and a plurality of terminals communicating with the plurality of wiring patterns, respectively, the plurality of terminals not covered by the protective layer. Pitch between the plurality of terminals adjacent to each other includes a first pitch and a second pitch wider than the first pitch. At least one of the plurality of wiring patterns, the terminals of which are adjacent to each other at the second pitch, includes a portion of expanded width having a width wider than a width of the plurality of terminals. The portion of expanded width is covered with the protective layer.

11 Claims, 24 Drawing Sheets

(51) Int. Cl.
*H05K 3/36* (2006.01)
*H05K 1/14* (2006.01)
*H01L 27/20* (2006.01)
*H01L 41/047* (2006.01)
*H01L 41/09* (2006.01)
*H05K 1/02* (2006.01)
*H01L 41/04* (2006.01)

(52) U.S. Cl.
CPC ..... *B41J 2002/14491* (2013.01); *H01L 27/20* (2013.01); *H01L 41/042* (2013.01); *H01L 41/0475* (2013.01); *H01L 41/0973* (2013.01); *H05K 1/028* (2013.01); *H05K 2201/0979* (2013.01); *H05K 2201/09409* (2013.01); *H05K 2201/09727* (2013.01)

(56) References Cited

U.S. PATENT DOCUMENTS

| | | |
|---|---|---|
| 8,371,679 B2 * | 2/2013 | Miyata ................ B41J 2/14233 347/50 |
| 2012/0069095 A1 | 3/2012 | Kida et al. |
| 2012/0212547 A1 | 8/2012 | Takemoto et al. |
| 2012/0229542 A1 | 9/2012 | Kida |
| 2014/0022305 A1 | 1/2014 | Kida |
| 2015/0029270 A1 | 1/2015 | Takemoto et al. |
| 2016/0031212 A1 | 2/2016 | Kida |
| 2016/0152025 A1 | 6/2016 | Kida |

\* cited by examiner

FIG. 14A

| FIG. 14 | FIG. 14A |
|---|---|
| | FIG. 14B |

CREEPAGE DISTANCE (mm)

| EFFECTIVE VALUE OF OPERA-TIONAL VOLTAGE (V) | DEGREE OF CONTAMINATION | | | | |
|---|---|---|---|---|---|
| | 1a | 2 | | 3 | |
| | I, II, IIIa, IIIb | I | II | IIIa, IIIb | I |
| 10 | 0.08 | 0.4 | 0.4 | 0.4 | 0.1 |
| 12.5 | 0.09 | 0.42 | 0.42 | 0.42 | 1.05 |
| 16 | 0.1 | 0.45 | 0.45 | 0.45 | 1.1 |
| 20 | 0.11 | 0.48 | 0.48 | 0.48 | 1.2 |
| 25 | 0.125 | 0.5 | 0.5 | 0.5 | 1.25 |
| 32 | 0.14 | 0.53 | 0.53 | 0.53 | 1.3 |
| 40 | 0.16 | 0.56 | 0.8 | 1.1 | 1.4 |
| 50 | 0.18 | 0.6 | 0.85 | 1.2 | 1.5 |

MATERIAL GROUP

| II | IIIa, IIIb (Note) |
|---|---|
| 0.1 | 0.1 |
| 1.05 | 1.05 |
| 1.1 | 1.1 |
| 1.2 | 1.2 |
| 1.25 | 1.25 |
| 1.3 | 1.3 |
| 1.6 | 1.8 |
| 1.7 | 1.9 |

FIG. 14B

| 63 | 0.2 | 0.63 | 0.9 | 1.25 | 1.6 | 1.8 | 2.0 |
|---|---|---|---|---|---|---|---|
| 80 | 0.22 | 0.67 | 0.9 | 1.3 | 1.7 | 1.9 | 2.1 |
| 100 | 0.25 | 0.71 | 1.0 | 1.4 | 1.8 | 2.0 | 2.2 |
| 125 | 0.28 | 0.75 | 1.05 | 1.5 | 1.9 | 2.1 | 2.4 |
| 160 | 0.32 | 0.8 | 1.1 | 1.6 | 2.0 | 2.2 | 2.5 |
| 200 | 0.42 | 1.0 | 1.4 | 2.0 | 2.5 | 2.8 | 3.2 |
| 250 | 0.56 | 1.25 | 1.8 | 2.5 | 3.2 | 3.6 | 4.0 |
| 320 | 0.75 | 1.6 | 2.2 | 3.2 | 4.0 | 4.5 | 5.0 |
| 400 | 1.0 | 2.0 | 2.8 | 4.0 | 5.0 | 5.6 | 6.3 |
| 500 | 1.3 | 2.5 | 3.6 | 5.0 | 6.3 | 7.1 | 8.0 |
| 630 | 1.8 | 3.2 | 4.5 | 6.3 | 8.0 | 9.0 | 10 |
| 800 | 2.4 | 4.0 | 5.6 | 8.0 | 10 | 11 | 12.5 |
| 1000 | 3.2 | 5.0 | 7.1 | 10 | 12.5 | 14 | 16 |
| 1250 | 4.2 | 6.3 | 9.0 | 12.5 | 16 | 18 | 20 |
| 1600 | 5.6 | 8.0 | 11 | 16 | 20 | 22 | 25 |
| 2000 | 7.5 | 10 | 14 | 20 | 25 | 28 | 32 |

WIRING SUBSTRATE, WIRING MEMBER, LIQUID DISCHARGE HEAD, LIQUID DISCHARGE DEVICE, AND LIQUID DISCHARGE APPARATUS

CROSS-REFERENCE TO RELATED APPLICATIONS

This patent application is based on and claims priority pursuant to 35 U.S.C. § 119(a) to Japanese Patent Application No. 2016-225508, filed on Nov. 18, 2016 in the Japan Patent Office and Japanese Patent Application No. 2017-175812, filed on Sep. 13, 2017 in the Japan Patent Office, the entire disclosures of which are hereby incorporated by reference herein.

BACKGROUND

Technical Field

Aspects of the present disclosure relate to a wiring substrate, a wiring member, a liquid discharge head including the wiring substrate, a liquid discharge device including the liquid discharge head, and a liquid discharge apparatus including the liquid discharge device.

Related Art

As a wiring substrate, there is a flexible printed circuit (FPC), a flexible flat cable (FFC), and a printed substrate, for example. An electrical connection part in the wiring substrate has a terminal, a conductor (wiring pattern) of which is exposed without being covered with insulation coating. Therefore, for safety reasons, the space (spatial distance, creepage distance) between adjacent terminals must be large where the potential difference between terminals is large.

A printed substrate is known that includes an insulating board having a connecting portion and three or more conductive patterns. The connecting portion projects from a body to be inserted into a connector. The conductive patterns contain silver and are formed parallel to each other on the connecting portion. The conductive patterns are connected to terminals of the connector, and voltage is applied to the conductive patterns. An interval between a first pair of adjacent conductive patterns having the maximum average voltage difference among all the conductive patterns is made wider than an interval between another adjacent second pair of conductive patterns.

SUMMARY

In an aspect of this disclosure, a novel wiring substrate includes a plurality of wiring patterns, a protective layer to cover the plurality of wiring patterns and regions between the plurality of wiring patterns, and a plurality of terminals communicating with the plurality of wiring patterns, respectively, the plurality of terminals not covered by the protective layer. The pitch between the plurality of terminals adjacent to each other includes a first pitch and a second pitch wider than the first pitch. At least one of the plurality of wiring patterns, the terminals of which are adjacent to each other at the second pitch, includes a portion of expanded width having a width wider than a width of the plurality of terminals. The portion of expanded width is covered with the protective layer, and an interval between the portion of expanded width of the at least one of the plurality of wiring patterns and another wiring pattern adjacent to the portion of expanded width is narrower than an interval between the plurality of terminals adjacent to each other at the second pitch.

In another aspect of this disclosure, a wiring member includes a first wiring substrate of the wiring substrate and a second wiring substrate on which a plurality of second terminals are disposed. The first wiring substrate and the second wiring substrate are electrically connected to each other, the second wiring substrate includes a dummy terminal disposed between the plurality of terminals adjacent to each other at the second pitch on the first wiring substrate, and the dummy terminal is adjacent to the plurality of second terminals at the first pitch.

In still another aspect of this disclosure, a liquid discharge head includes a body including a nozzle face in which a plurality of nozzles is formed to discharge liquid, and the wiring member described above connected to the body.

In still another aspect of this disclosure, a liquid discharge device includes the liquid discharge head.

In still another aspect of this disclosure, a liquid discharge apparatus includes the liquid discharge device.

BRIEF DESCRIPTION OF THE SEVERAL VIEWS OF THE DRAWINGS

The aforementioned and other aspects, features, and advantages of the present disclosure will be better understood by reference to the following detailed description when considered in connection with the accompanying drawings, wherein:

FIGS. 14A and 14B (collectively referred to as FIG. 14) are tables to illustrate an example of a relation between voltage applied to the terminals and a required creepage distance;

FIG. 22 is an enlarged cross-sectional view of a main portion of the body of

Figure 1:
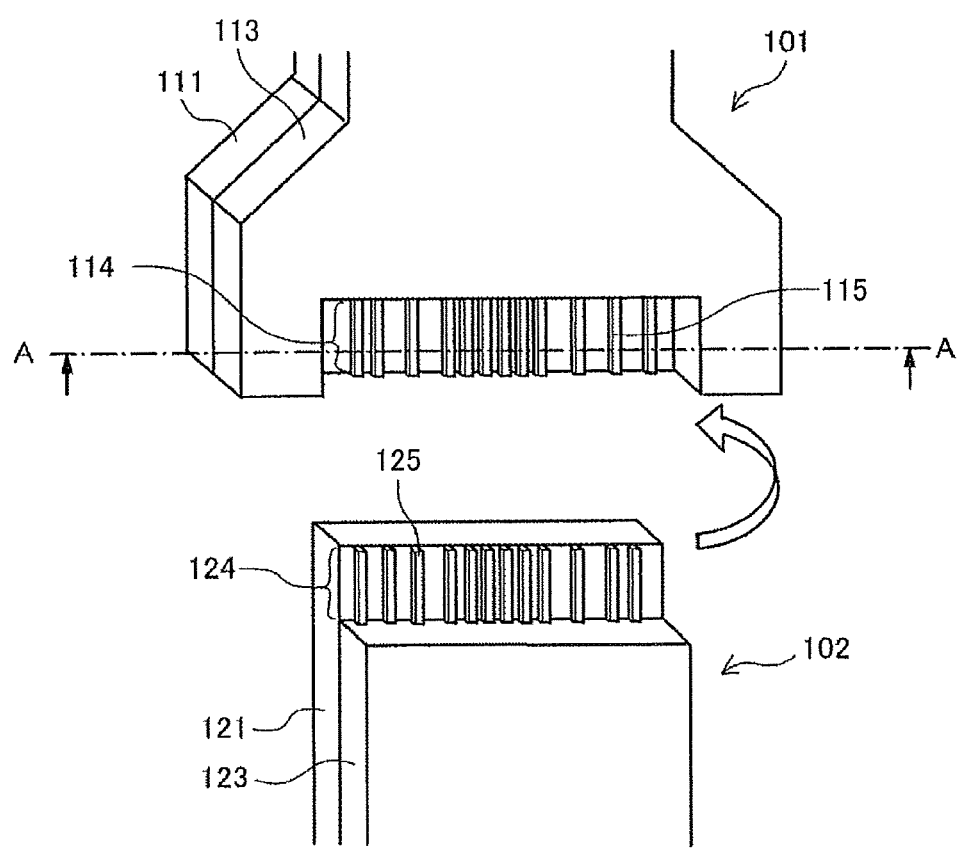
FIG. 1 is a perspective view of a wiring substrate according to a first embodiment of the present disclosure.

The accompanying drawings are intended to depict embodiments of the present disclosure and should not be interpreted to limit the scope thereof. The accompanying drawings are not to be considered as drawn to scale unless explicitly noted.

DETAILED DESCRIPTION

In describing embodiments illustrated in the drawings, specific terminology is employed for the sake of clarity. However, the disclosure of this patent specification is not intended to be limited to the specific terminology so selected and it is to be understood that each specific element includes all technical equivalents that have the same function, operate in a similar manner, and achieve similar results.

Although the embodiments are described with technical limitations with reference to the attached drawings, such description is not intended to limit the scope of the disclosure and all of the components or elements described in the embodiments of this disclosure are not necessarily indispensable. As used herein, the singular forms "a", "an", and "the" are intended to include the plural forms as well, unless the context clearly indicates otherwise.

Referring now to the drawings, wherein like reference numerals designate identical or corresponding parts throughout the several views, embodiments of the present disclosure are described below.

Next, a first embodiment of the present disclosure is described with reference to FIGS. 1 through 6.

FIG. 1 is a perspective view of a wiring substrate according to the first embodiment.

Figure 2:
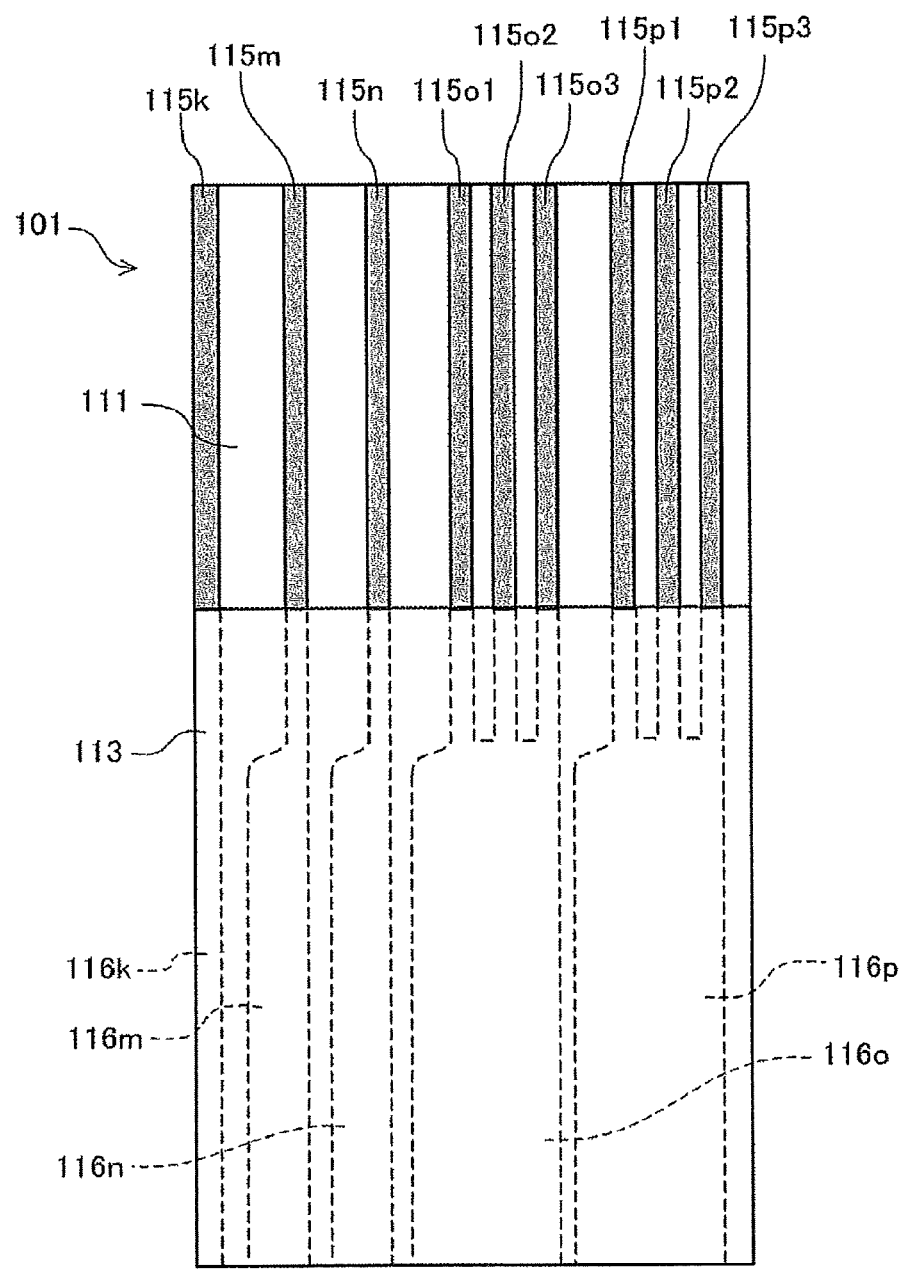
FIG. 2 is a plan view of a wiring pattern of the wiring substrate according in the first embodiment.

FIG. 2 is a plan view of a wiring pattern of the wiring substrate.

Figure 3:
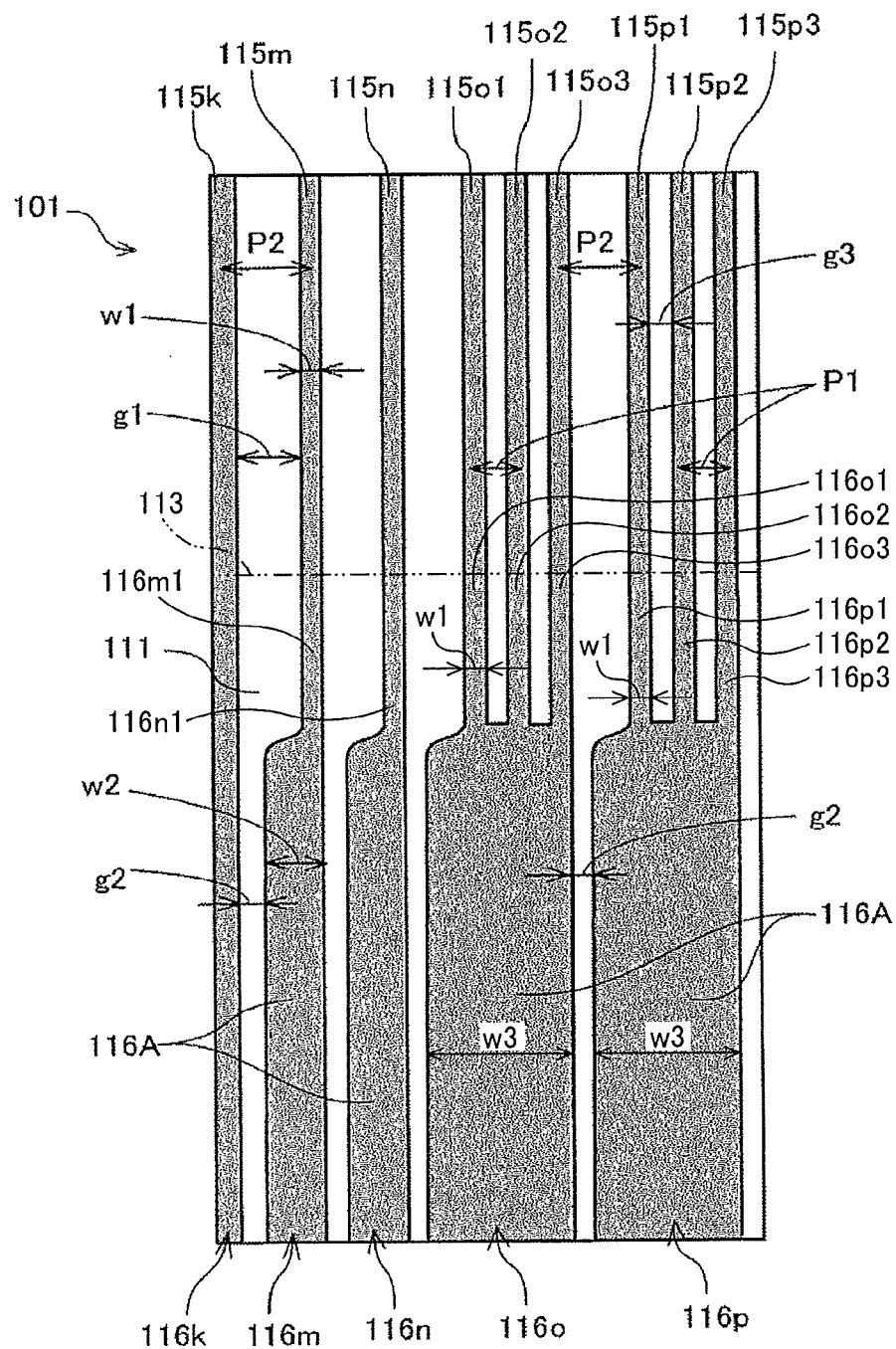
FIG. 3 is a plan view of the wiring pattern of the wiring substrate in a state in which a protective layer is removed from the wiring pattern.

FIG. 3 is a plan view of the wiring pattern of the wiring substrate in a state in which a protective layer is removed from the wiring pattern.

Figure 4:
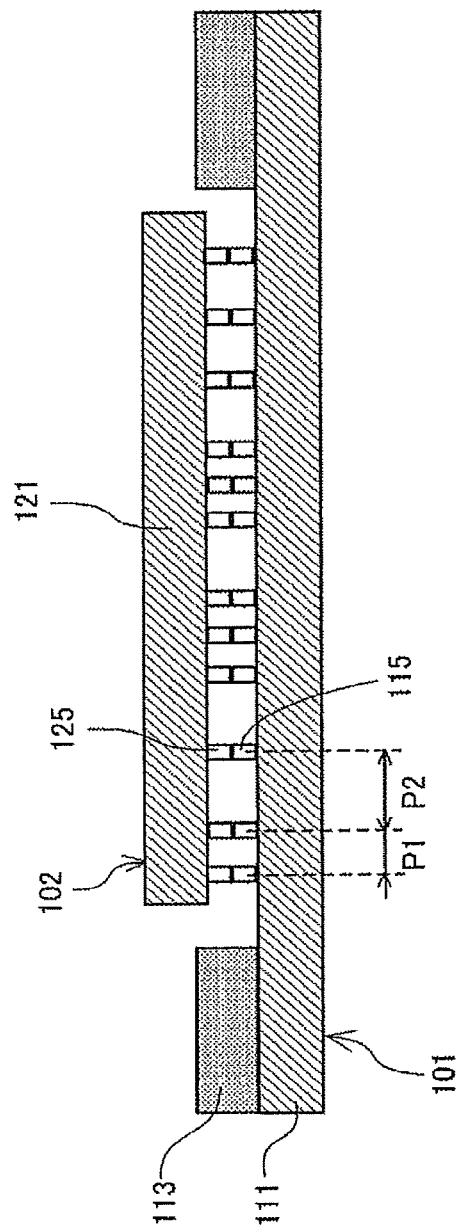
FIG. 4 is a cross-sectional view of the wiring substrate in a connected state along line A-A of FIG. 1.

FIG. 4 is a cross-sectional view of the wiring substrate along line A-A of FIG. 1 in a state the wiring substrates are connected with each other.

Figure 5:
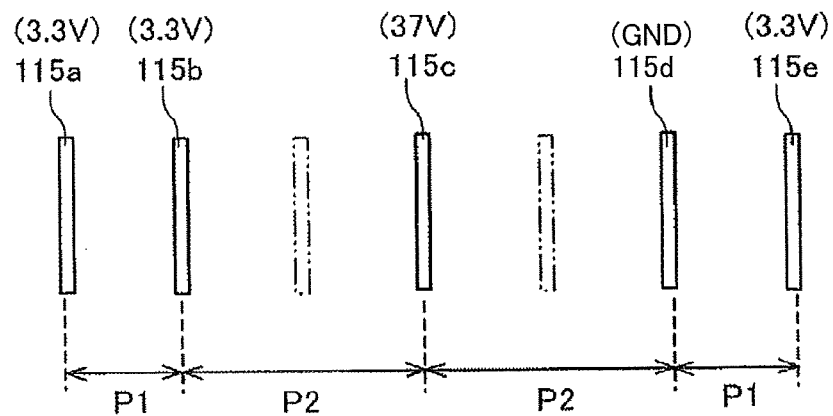
FIG. 5 is a schematic view of an example of pitch of an arrangement of the terminals.
Figure 6:
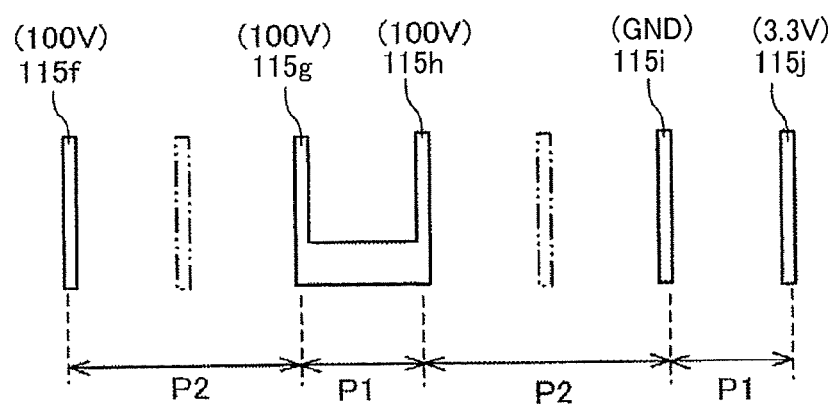
FIG. 6 is a schematic view of another example of pitch of an arrangement of the terminals.

FIGS. 5 and 6 are plan views of different examples of terminals of the wiring pattern illustrating a wiring pitch of the terminals.

In the first wiring substrate 101, a plurality of wiring patterns 116 (collectively referred to as wiring patterns 116) are arranged on a substrate (base member) 111 such as a film. A protective layer 113 covers each of the individual wiring patterns 116$k$, 116$m$, 116$n$, 116$o$, and 116$p$ and an area between each of the wiring patterns 116$k$, 116$m$, 116$n$, 116$o$, and 116$p$ (in this example, a surface of the substrate). The protective layer 113 can be formed by applying a coating of an insulating film or an insulating material to the substrate, for example.

The first wiring substrate 101 includes a plurality of terminals 115 not covered by the protective layer 113. The plurality of terminals 115 communicates with each of the wiring patterns 116. This area of the terminals 115 not covered with the protective layer 113 serves as an electrical connection portion 114.

Note that as long as the terminals 115 are in communication with the wiring pattern 116, a part (exposed portion) of the wiring pattern 116 may be formed as the terminals 115. Alternatively, the terminals 115 different from the wiring pattern 116 may be provided so that the terminals 115 are connected to the wiring pattern 116.

Similar to the first wiring substrate 101, in a second wiring substrate 102, a plurality of wiring patterns are arranged on a substrate (base member) 121 such as a film. A protective layer 113 covers each of the wiring patterns and an area between each of the wiring patterns (in this example, a surface of the substrate 121).

The second wiring substrate 102 includes a plurality of terminals 125 not covered by the protective layer 113. The plurality of terminals 125 communicates with each of the wiring patterns. This area of the terminals 125 not covered with the protective layer 113 serves as an electrical connection portion 124.

Here, the substrates 111 and 121 are flexible electrically insulating films, for example, formed of polyethylene terephthalate (PET), more preferably polyimide. Ni/Au plating or the like is applied to the surfaces of the terminals 115 and 125. Further, although the insulating film member is used for the protective layers 113 and 123, a coated insulating material may be used for the protective layers 113 and 123. The protective layers 113 and 123 cover the wiring patterns 116 and other parts of the first wiring substrate 101 and the second wiring substrate 102 in a region excluding the terminals 115 and 125.

Here, as illustrated in FIGS. 3 and 4, there is a first pitch P1 and a second pitch P2 between the adjacent terminals 115 of the first wiring substrate 101. The first pitch P1 and the second pitch P2 are distances between the centers of the terminals 115 in the arrangement direction of the terminals 115. The second pitch P2 is wider than the first pitch P1. Here, the second pitch P2 is n times (n is an integer of 2 or more) the size of the first pitch P1, but the number "n" is not limited to two and may be any other number.

It is preferable that the first pitch P1 is made equal to an arrangement pitch of the probes of the general-purpose inspection apparatus and a pitch of the general-purpose wiring substrate having an equal pitch. When this general-purpose inspection apparatus is used, it is preferable that the second pitch P2 is an integral multiple of the first pitch P1.

Specifically, for example, as illustrated in FIG. 5, terminals 115$a$, 115$b$, 115$c$, 115$d$, and 115$e$ are arranged side by side. A voltage of GND (ground voltage) is applied to the terminal 115$d$. A voltage of zero to 3.3V with respect to GND is applied to the terminals 115a, 115b and 115e. A voltage of 37V with respect to GND is applied to the terminal 115c.

At this time, the potential difference between the terminals 115a and 115b is 0 to 3.3 V. The potential difference between the terminals 115b and 115c is (37−3.3=33.7 V). The potential difference between the terminals 115c and 115d is 37 V. The potential difference between the terminals 115d and 115e is 0 to 3.3 V.

Therefore, the terminal 115c has a large potential difference with the adjacent terminal 115b. Thus, the second pitch P2 between the terminal 115b and the terminal 115c is wider than the first pitch P1 between the terminal 115a and the terminal 115b. Similarly, the terminal 115c has a large potential difference with the adjacent terminal 115d. Thus, the second pitch P2 between the terminal 115c and the terminal 115d is wider than the first pitch P1 between the terminal 115d and the terminal 115e.

Further, as illustrated in FIG. 6, for example, terminals 115f, 115g, 115h, 115i, and 115j are arranged side by side. A voltage of GND (ground voltage) is applied to the terminal 115i. A voltage of 0 to 3.3 V with respect to GND is applied to the terminal 115j. A voltage of 100 V with respect to GND is applied to the terminals 115f, 115g, and 115h.

At this time, as described above in FIG. 5, the potential difference between the terminals 115f and 115g is zero when different pitch P1 and P2 is provided between the terminals 115 according to the potential difference between the adjacent terminals 115. Thus, the pitch between the terminals 115f and 115g becomes the first pitch P1.

However, in order to secure the insulation property for the terminals 115 on which a high voltage is applied, it is preferable to arrange the terminals 115 at the second pitch P2 wider than the first pitch P1. Therefore, although the potential difference between the terminals 115f and 115g is zero, the terminals 115f and 115g are arranged at the second pitch P2 since a high voltage is applied to the terminals 115f and 115g.

In this case, the terminals 115g and 115h are arranged at the first pitch P1, similarly to the allocation of the pitch corresponding to the potential difference between the adjacent terminals 115 in FIG. 5, since the terminals 115g and 115h are connected to the identical wiring pattern 116. Thus, the plurality of terminals 115f, 115g, 115h, 115i, and 115j includes two or more terminals 115g and 115h communicating with an identical one of the plurality of wiring patterns 116, and a pitch between the two or more terminals 115g and 115h is the first pitch P1.

Next, the wiring pattern in the present embodiment is described with reference to FIG. 3.

In an example illustrated in FIG. 3, terminals 115k, 115m, 115n, 115o1 to 115o3, and 115p1 to 115p3 are arranged.

Each of a pitch between the terminals 115k and 115m, a pitch between the terminals 115m and 115n, a pitch between the terminals 115n and 115o1, and a pitch between the terminals 115o3 and 115p1 is set to the second pitch P2.

On the other hand, a pitch between the terminal 115o1 and the terminal 115o2, a pitch between the terminal 115o2 and the terminal 115o3, a pitch between the terminal 115p1 and the terminal 115p2, and a pitch between the terminal 115p2 and the terminal 115p3 are set to the first pitch P1.

An interval between the adjacent terminals 115o1 and 115o2, an interval between the terminals 115o2 and 115o3, an interval between the terminals 115p1 and 115p2, and an interval between the terminals 115p2 and 115p3 are set to an interval g3. The interval g is a distance between an edge of one terminal and an edge of adjacent another terminal. On the other hand, the pitch P is a distance between the centers of the adjacent terminals 115.

The terminals 115k, 115m, 115n are in communication with the wiring patterns 116k, 116m, and 116n, respectively. Further, the terminals 115o1 to 115o3 communicate with one wiring pattern 116o, and the terminals 115p1 to 115p3 also communicate with one wiring pattern 116p.

Here, at least one of the two wiring patterns 116 corresponding to the two adjacent terminals disposed at the second pitch P2 has a portion of expanded width 116A having a terminal width w2 wider than the terminal width w1.

For example, one of the wiring pattern 116m of the wiring patterns 116k and 116m has a portion of expanded width 116A. The wiring pattern 116m has a width w2 wider than the width w1 of the terminal 115m. The adjacent wiring patterns 116k and 116m are communicating with the adjacent terminals 115k and 115m, respectively.

An interval g2 between the portion of expanded width 116A of one of the wiring pattern 116m and the another wiring pattern 116k is narrower than an interval g1 between two terminals 115m and 115k adjacent to each other at the second pitch P2.

For example, in the above example, the interval g2 between the portion of expanded width 116A of the one of the wiring pattern 116m and the another wiring pattern 116k is narrower than the interval g1 between the two terminals 115k and 115m adjacent to each other at second pitch P2. The wiring patterns 116k and 116m are communicating with the terminals 115k and 115m adjacent to each other at the second pitch P2, respectively.

Similarly, the interval g2 between the portion of expanded width 116A of the wiring pattern 116o of one of the wiring patterns 116o and 116p and the portion of expanded width 116A of the another wiring pattern 116p is narrower than the interval g1 between the two adjacent terminals 115o3 and 115p1 which are adjacent to each other at the second pitch P2. The wiring patterns 116o and 116p are communicating with the terminals 115o3 and 115p1 adjacent to each other at the second pitch P2, respectively.

In this case, the portion of expanded width 116A is formed by enlarging a width of one wiring pattern 116m in a direction of another terminal adjacent to each other at the second pitch P2. That is, the portion of expanded width 116A is formed in a space between the adjacent wiring patterns 116 arranged at the second pitch P2.

That is, a short circuit between the wiring patterns 116 can be prevented in the region of the wiring pattern 116 and the region between the wiring patterns 116 covered by the protective layer 113. Thus, the interval g2 between the wiring patterns 116 can be made narrower than the interval g1 between the terminals 115 that is not covered with the protective layer 113.

Therefore, in the region covered with the protective layer 113, the wiring pattern 116 is provided with the portion of expanded width 116A to reduce the resistance value of the wiring pattern 116.

The wiring pattern 116m includes the portion of expanded width 116A having the width w2 and a portion 116m1 having the width w1. Both of the portion of expanded width 116A and the portion 116m1 of the wiring pattern 116m are covered with the protective layer 113.

The wiring pattern 116n includes the portion of expanded width 116A having the width w2 and a portion 116n1 having the width w1. Both of the portion of expanded width 116A and the portion 116n1 of the wiring pattern 116n are covered with the protective layer 113.

The wiring pattern 116*o* includes the portion of expanded width 116A having a width w3 wider than the width w2 and portions 116*o*1, 116*o*2, and 116*o*3 having the width w1. The portions 116*o*1, 116*o*2, and 116*o*3 are joined together and communicating with each other at the portion of expanded width 116A. All the portion of expanded width 116A and the portions 116*o*1, 116*o*2, and 116*o*3 of the wiring pattern 116*o* are covered with the protective layer 113.

The wiring pattern 116*p* includes the portion of expanded width 116A having a width w3 wider than the width w2 and portions 116*p*1, 116*p*2, and 116*p*3 having the width w1. The portions 116*p*1, 116*p*2, and 116*p*3 are joined together and communicating with each other at the portion of expanded width 116A. All the portion of expanded width 116A and the portions 116*p*1, 116*p*2, and 116*p*3 of the wiring pattern 116*p* are covered with the protective layer 113.

In this manner, at least one of the wiring patterns adjacent to each other at the second pitch P2 has a portion of expanded width having a width w2 wider than the width w1 of the terminal. In the portion of expanded width, regions between the portion of expanded width and a wiring pattern adjacent to the portion of expanded width are covered with the protective layer. The interval g2 between the portion of expanded width of one wiring pattern and another wiring pattern is made narrower than the interval g1 between the terminals adjacent to each other at the second pitch P2. Therefore, the present embodiment can reduce the resistance value of the wiring pattern.

In addition, the interval g2 between the portion of expanded width 116A of one wiring pattern 116 and another wiring pattern 116 is made narrower than the first pitch P1.

Here, the region between the portion of expanded width 116A of the wiring pattern 116 and another wiring pattern 116 is covered with the insulating protective layer 113. Thus, the interval g2 between the portion of expanded width 116A of the wiring pattern 116 and another wiring pattern 116 can be sufficiently made narrower than the referential pitch (first pitch P1) between the adjacent terminals.

That is, the resistance value of the wiring pattern 116 can be further reduced by widening (thickening) the width of the portion of expanded width 116A of the wiring pattern 116. Thus, it is possible to reduce an amount of heat generated by the wiring pattern 116 and to increase the current capacity of the wiring pattern 116. The referential pitch (the first pitch P1) between the terminals 115 is determined by a creepage distance necessary for securing the insulation between the terminals 115.

In the present embodiment, as illustrated in FIG. 4, the pitch P1 or P2 of the terminals 125 of the second wiring substrate 102 connected to the first wiring substrate 101 is also disposed to be the same pitch P1 or P2 with the pitch of the terminals 115 of the first wiring substrate 101.

Therefore, it is unnecessary to provide extra terminals and wiring patterns not electrically connected.

A wiring substrate according to another embodiment of the present disclosure is described with reference to FIGS. 7 and 8.

Figure 7:
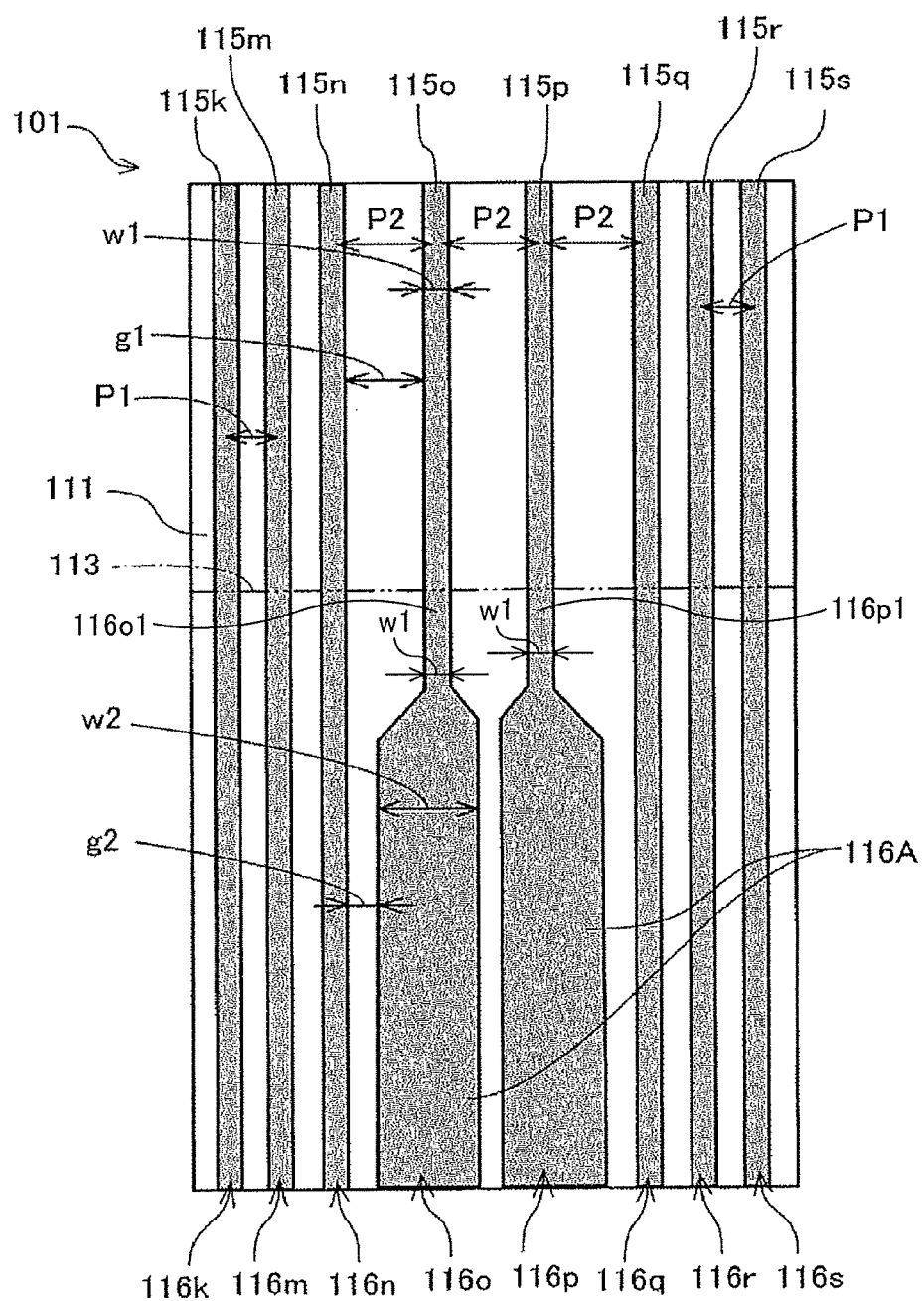
FIG. 7 is a plan view of a wiring pattern of the wiring substrate according to another first example.

FIG. 7 is a plan view of a wiring pattern of the wiring substrate according to another first example. Here, the protective layer is illustrated such that the wiring pattern can be seen through the protective layer. FIG. 8 is a plan view of the wiring pattern of a second example in which the wiring pattern can be seen through the protective layer.

In a first example illustrated in FIG. 7, terminals 115*k*, 115*m*, 115*n*, 115*o*, 115*p*, 115*q*, 115*r*, and 115*s* are arranged.

A pitch between the terminals 115*n* and 115*o*, a pitch between the terminals 115*o* and 115*p*, and a pitch between the terminals 115*p* and 115*q* are set to a second pitch P2, and pitch of other terminals are set to a first pitch P1.

Here, the wiring patterns 116*o* and 116*p* includes a portion of expanded width 116A having a width w2 wider than a width w1 of the terminals 115 spread in both sides in a terminal arrangement direction. The wiring patterns 116*o* and 116*p* are communicating with the terminals 115*o* and 115*p* arranged adjacent to each other at the second pitch P2 wider than the first pitch P1.

The wiring pattern 116*o* includes the portion of expanded width 116A having the width w2 and a portion 116*o*1 having the width w1. Both of the portion of expanded width 116A and the portion 116*o*1 of the wiring pattern 116*o* are covered with the protective layer 113.

The wiring pattern 116*p* includes the portion of expanded width 116A having the width w2 and a portion 116*p*1 having the width w1. Both of the portion of expanded width 116A and the portion 116*p*1 of the wiring pattern 116*p* are covered with the protective layer 113.

An interval g2 between the portion of expanded width 116A of one of the wiring pattern 116*c* and another wiring pattern 116*n* is narrower than an interval g1 between two terminals 115*c* and 115*n* adjacent to each other at the second pitch P2.

Thereby, it is possible to reduce the number of bent portions of the wiring pattern which are liable to be disconnected when the wiring board is bent, thereby improving reliability.

Figure 8:
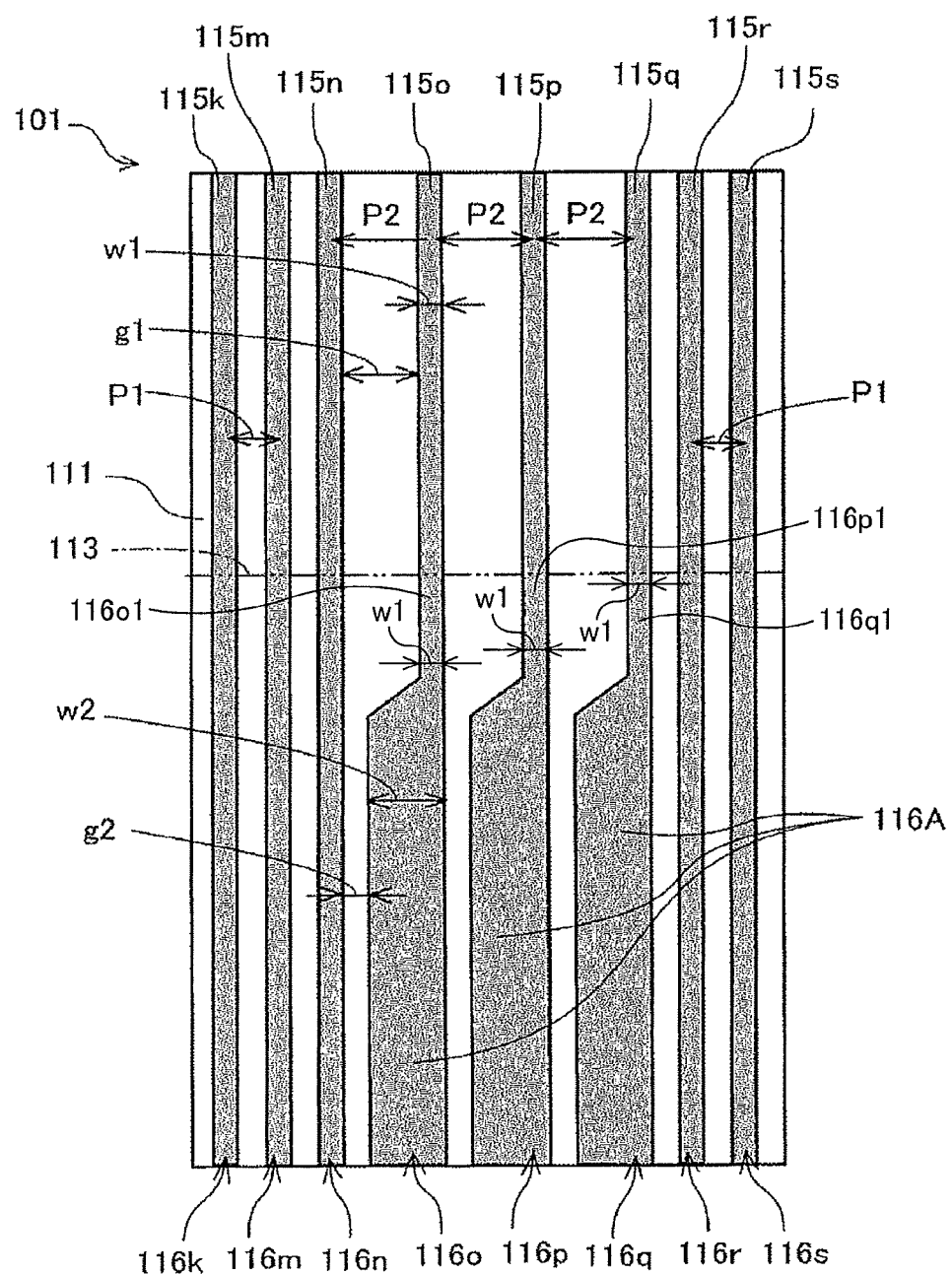
FIG. 8 is a plan view of a wiring pattern of the wiring substrate according to another second example.

In a second example illustrated in FIG. 8, terminals 115*k*, 115*m*, 115*n*, 115*o*, 115*p*, 115*q*, 115*r*, and 115*s* are arranged.

A pitch between the terminals 115*n* and 115*o*, a pitch between the terminals 115*o* and 115*p*, and a pitch between the terminals 115*p* and 115*q* are set to a second pitch P2, and pitch of other terminals are set to a first pitch P1. The second pitch P2 is wider than the first pitch P1.

Here, the wiring patterns 116*o*, 116*p*, and 116*q* include a portion of expanded width 116A having a width w2 wider than a width w1 of the terminals 115 spread in one side (left side in FIG. 8) in a terminal arrangement direction. The wiring patterns 116*o*, 116*p*, and 116*q* are communicating with the terminals 115*o*, 115*p*, and 115*q* arranged adjacent to each other at the second pitch P2 wider than the first pitch P1.

The wiring pattern 116*o* includes the portion of expanded width 116A having the width w2 and a portion 116*o*1 having the width w1. Both of the portion of expanded width 116A and the portion 116*o*1 of the wiring pattern 116*o* are covered with the protective layer 113.

The wiring pattern 116*p* includes the portion of expanded width 116A having the width w2 and a portion 116*p*1 having the width w1. Both of the portion of expanded width 116A and the portion 116*p*1 of the wiring pattern 116*p* are covered with the protective layer 113.

The wiring pattern 116*q* includes the portion of expanded width 116A having the width w2 and a portion 116*q*1 having the width w1. Both of the portion of expanded width 116A and the portion 116*q*1 of the wiring pattern 116*q* are covered with the protective layer 113.

The interval g2 between the portion of expanded width 116A of one of the wiring pattern 116*o* and another wiring pattern 116*n* is narrower than the interval g1 between two terminals 115*o* and 115*n* adjacent to each other at the second pitch P2.

As a result, as in the first example, it is possible to reduce the number of bent portions in the wiring pattern which are likely to be disconnected when the wiring board is bent, thereby improving reliability.

A second embodiment according to the present disclosure is described with reference to FIGS. 9 and 10.

Figure 9:
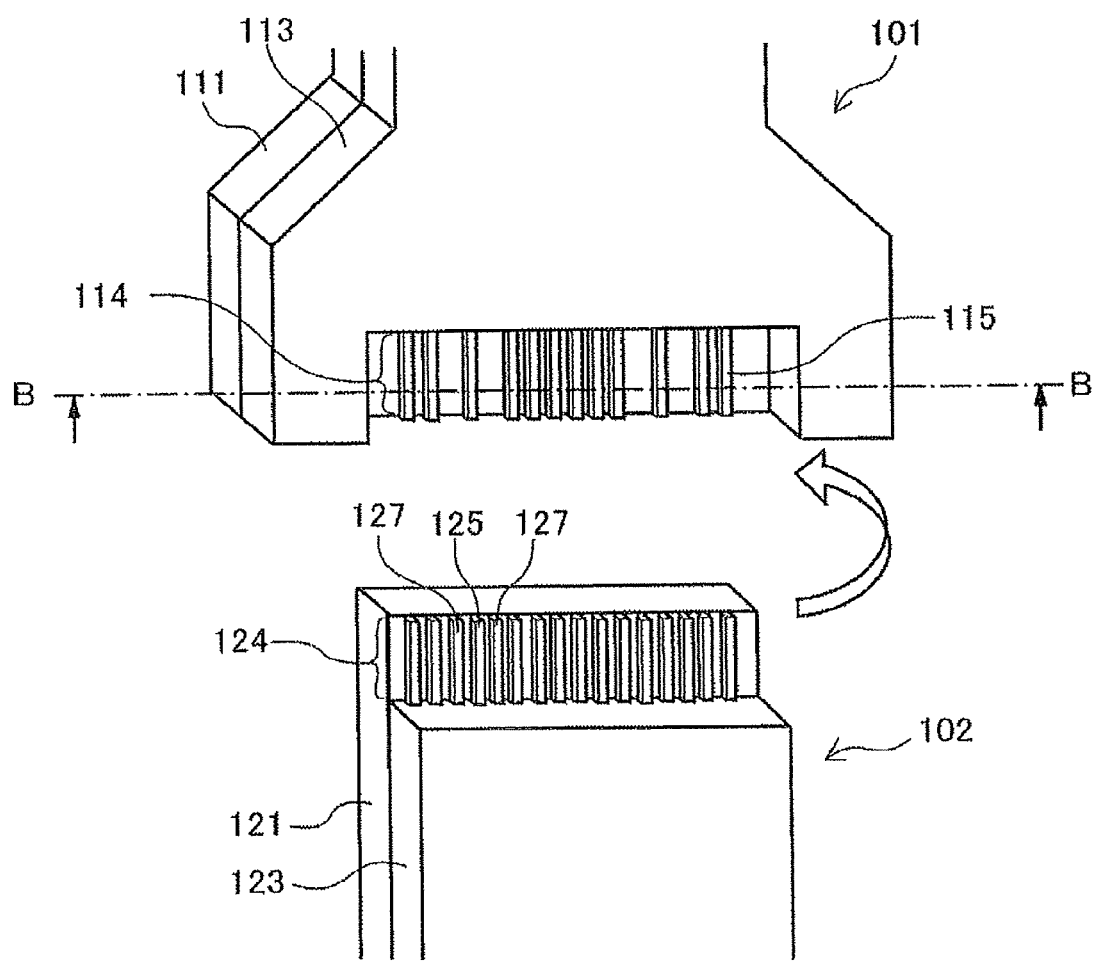
FIG. 9 is a perspective view of a wiring substrate according to a second embodiment of the present disclosure.
Figure 10:
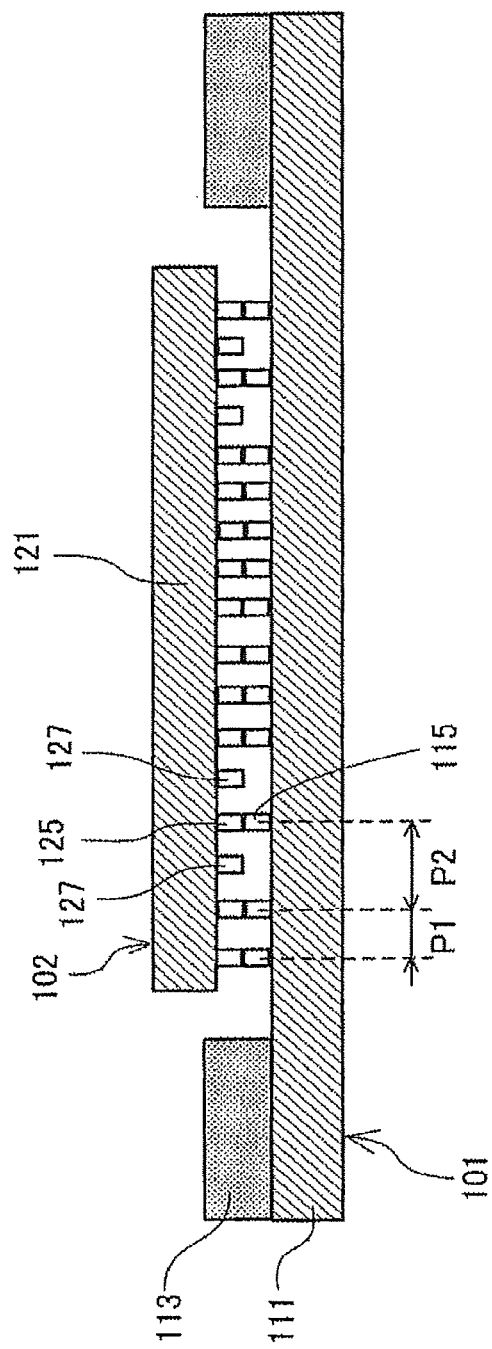
FIG. 10 is a cross-sectional view of the wiring substrate in a connected state along line B-B of FIG. 5.

FIG. 9 is a perspective view of a wiring substrate according to the second embodiment. FIG. 10 is a cross-sectional view of the wiring substrate along line B-B of FIG. 9 in a state the wiring substrates are connected with each other.

In the present embodiment, the first wiring substrate 101 has the same configuration as the first embodiment. However, in the second wiring substrate 102, all of the pitch of the terminals 125 is arranged to be equal to the first pitch P1.

Here, the terminals disposed between the terminals 115 arranged at the second pitch P2 of the first wiring substrate 101 are set to be dummy terminals 127 among the terminals 125 of the second wiring substrate 102. The dummy terminal 127 is not electrically connected anywhere.

Thus, the present embodiment prevents warpage and undulation of the electrical connection portion 114 since the terminals 125 and the dummy terminals 127 are continuously and regularly arranged at an equal pitch in the second wiring substrate 102.

A third embodiment according to the present disclosure is described with reference to FIG. 11.

Figure 11:
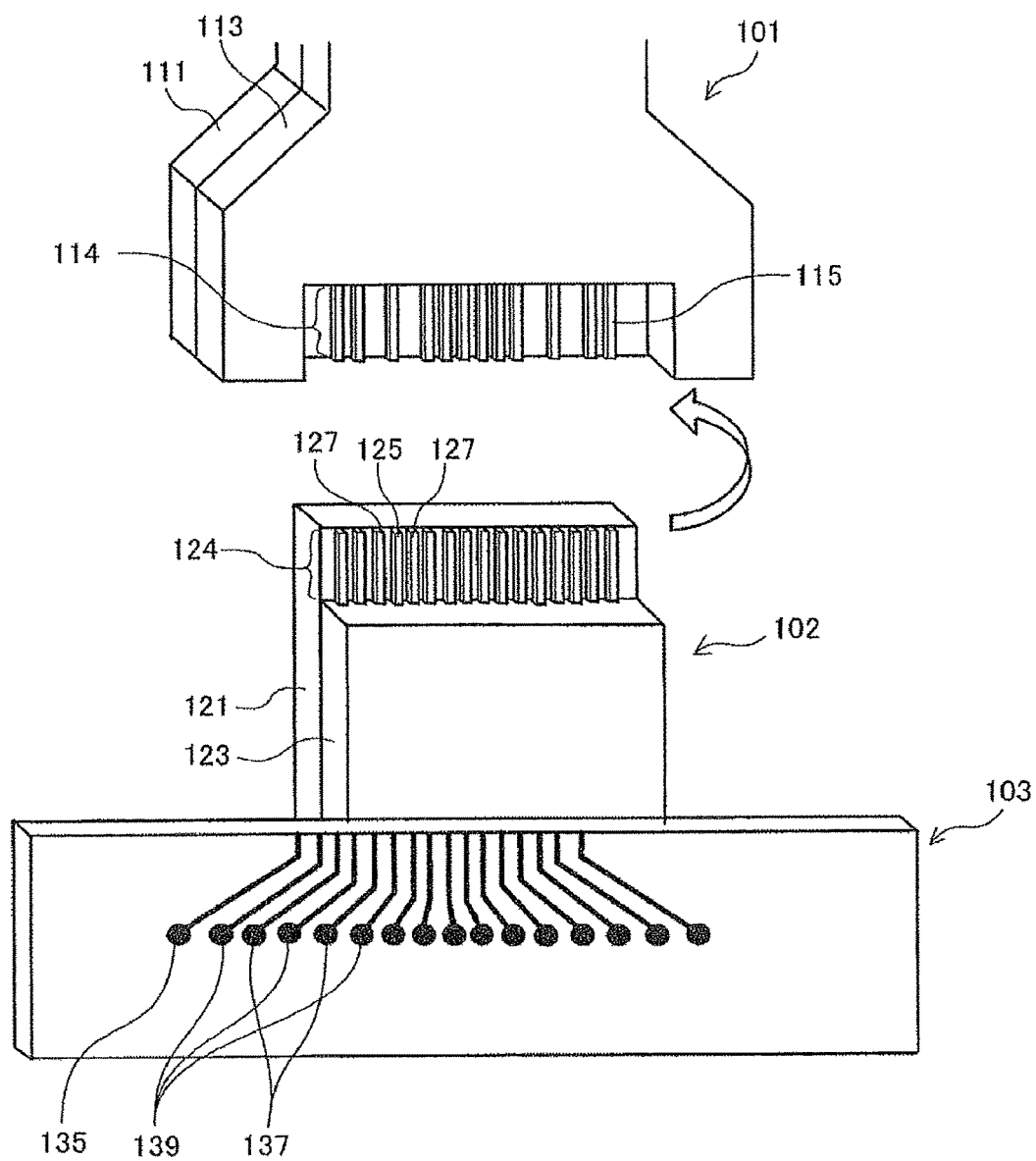
FIG. 11 is a perspective view of a wiring substrate according to a third embodiment of the present disclosure.

FIG. 11 is a perspective view of the third embodiment of the present disclosure. The third embodiment includes a printed substrate 103 connected to the second wiring substrate 102 of the second embodiment. On the printed substrate 103, a test pad 135 for connecting a probe of an electric checker is provided corresponding to a wiring pattern communicating with the terminal 125 of the second wiring substrate 102.

Therefore, it is possible to check whether a short circuit has occurred between the test pads 137 and 139. The test pads 137 are conducted to the dummy terminal 127, and the test pads 139 are conducted to the terminals adjacent to the dummy terminals 127.

Short-circuiting the dummy terminals 127 with the adjacent terminals 125 can check for a decrease in a substantial creepage distance between the terminals 125 to which a high voltage is applied and the terminals to which the high voltage is not applied, thereby preventing an occurrence of failure.

Figure 12:
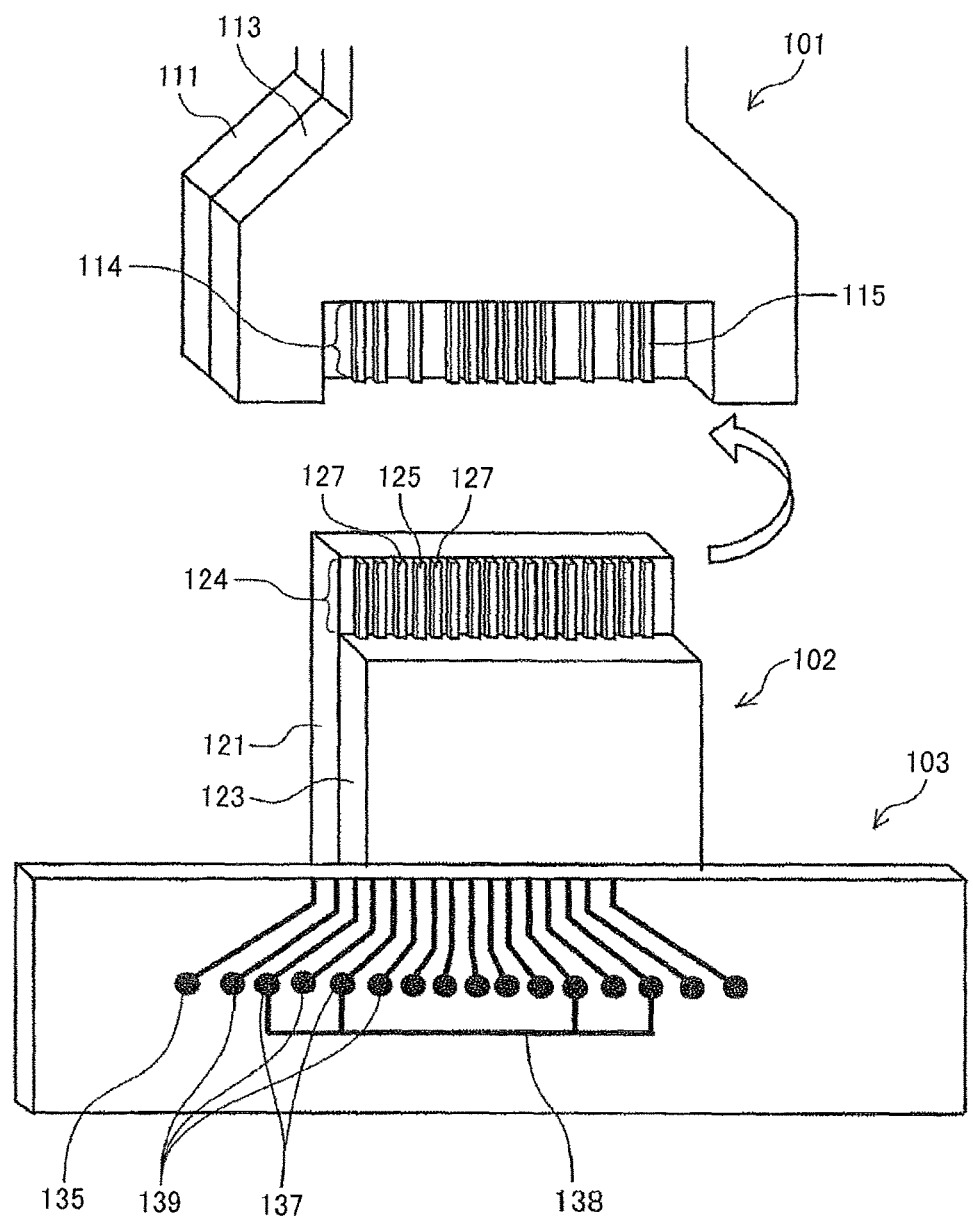
FIG. 12 is a perspective view of a wiring substrate according to a fourth embodiment of the present disclosure.

A fourth embodiment according to the present disclosure is described with reference to FIG. 12. FIG. 12 is a perspective view of the fourth embodiment of the present disclosure.

The present fourth embodiment as illustrated in FIG. 12 includes a connection pattern 138 for interconnecting a plurality of dummy terminals 127 of the second wiring substrate 102 on the printed substrate 103 in the third embodiment as illustrated in FIG. 11. The plurality of dummy terminals 127 may be interconnected with each other on the second wiring substrate 102.

To check for a short circuit between the dummy terminal 127 and the adjacent terminals 125, a probe of a checker is merely contacted against one of the test pads 137 corresponding to the dummy terminal 127 on the second wiring substrate 102. Thus, the fourth embodiment can reduce a cost for checking for a short circuit.

Figure 13:
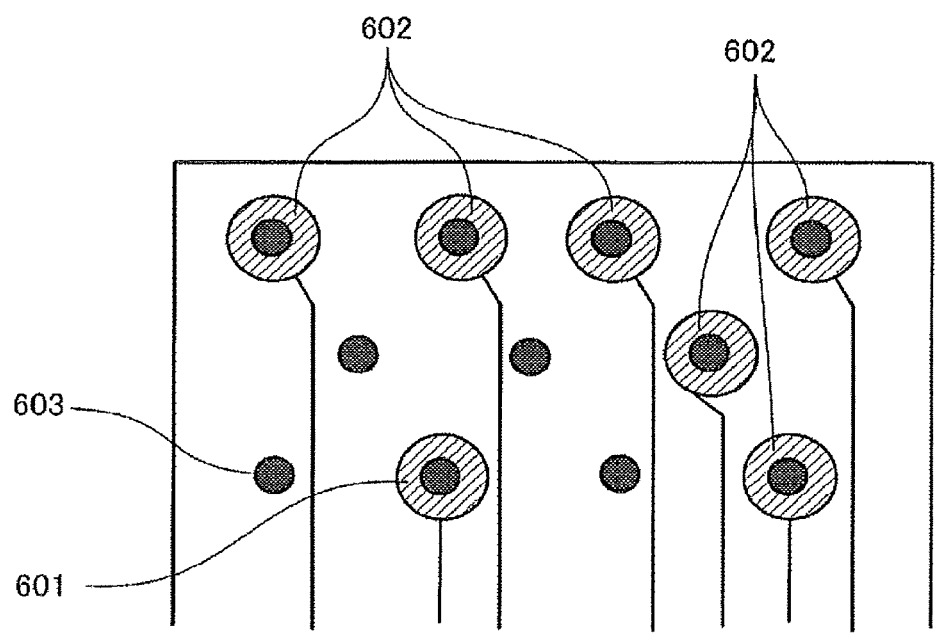
FIG. 13 is a plan view of a wiring substrate according to a fifth embodiment of the present disclosure.

A fifth embodiment according to the present disclosure is described with reference to FIG. 13. FIG. 13 is a plan view of the fifth embodiment of the present disclosure.

In the present embodiment, the virtual terminal positions 603 are arranged in a matrix at equal pitch (first pitch P1). A terminal 602 to which a low voltage or voltage of ground (GND) level is applied is disposed at a first pitch P1. A terminal 601 to which a high voltage is applied is disposed at a terminal position 603 at which a second pitch P2 is secured.

Here, the relation between the first pitch and the second pitch and the voltage applied to the terminals described in each of above embodiments is described with reference to FIG. 14, illustrating an example of the relation between the voltage applied to the terminals and a required creepage distance.

Generally, at voltages exceeding 50V, it is necessary to consider electrochemical migration (ion migration), tracking, etc. Therefore, a large creepage distance should be provided for the adjacent conductors (terminals) that should not be short-circuited.

On the other hand, it is unnecessary to consider electrochemical migration (ion migration) at a voltage of 50V or less. However, in order to ensure insulation, a large creepage distance is provided between adjacent conductors with a large potential difference.

In this case, there are various standards for a minimum value of the creepage distance to be secured, for example UL 840 (See FIG. 15) or UL 60950. A value of "n" is set so that the creepage distance becomes equal to or greater than the values illustrated in these values of UL 840 or UL 60950. The second pitch P2 is "n" times ("n" is an integer of 2 or more) of the first pitch P1.

In the above description, the pitch between the terminals is not limited to two. In case where terminals of three or more having a large difference in an electrical potential are mixed, a third pitch wider than the second pitch, or a fourth pitch wider than the third pitch may also be provided between the terminals.

Further, a "reference pitch" in which a necessary creepage distance can be secured between the terminals with the lowest potential difference is set for the pitch between the terminals. If the necessary creepage distance cannot be secured even when the pitch between the terminal is set two times of the reference pitch, the pitch may be widened such as three times, four times, or more the reference pitch.

As a general pitch of the terminals, there is 1 mm, 0.5 mm, 0.3 mm, or 0.2 mm, for example. Therefore, one of these general pitch described above is set as a reference pitch. Twice of the reference pitch are provided for the terminals in which a creepage distance of a reference pitch is insufficient with respect to a potential difference. Even if the necessary creepage distance cannot be attained by the twice of the referential pitch, the pitch is widened to have three times, four times, or more of the reference pitch.

Next, a wiring substrate according to a sixth embodiment of the present disclosure is described with reference also to FIGS. 1 to 3 and FIGS. 15 to 17 used in the description of the first embodiment.

FIG. 15 is a plan view of a main part of the wiring substrate of Comparative Example 1 used for explanation of the wiring substrate according to the present embodiment.

Figure 16:
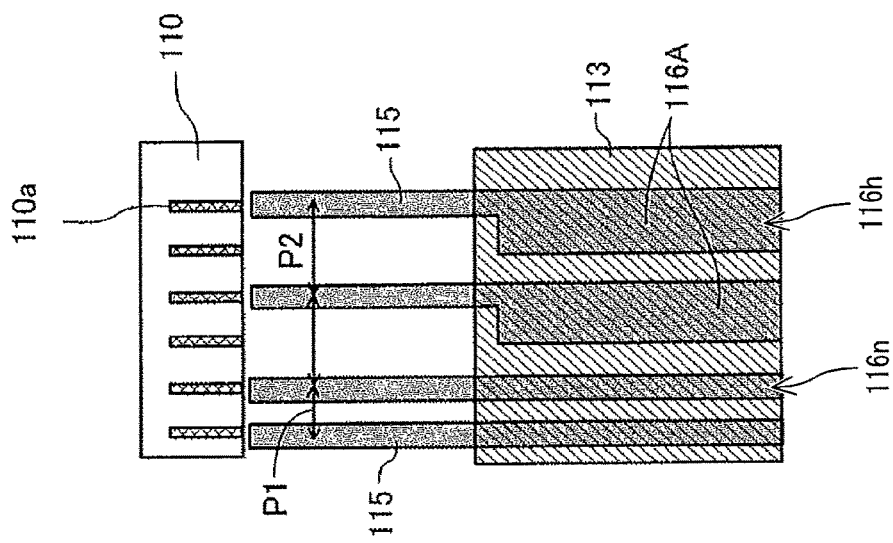
FIG. 16 is a plan view of a main part of the wiring substrate of Comparative Example 2.

FIG. 16 is a plan view of a main part of the wiring substrate of Comparative Example 2.

Figure 17:
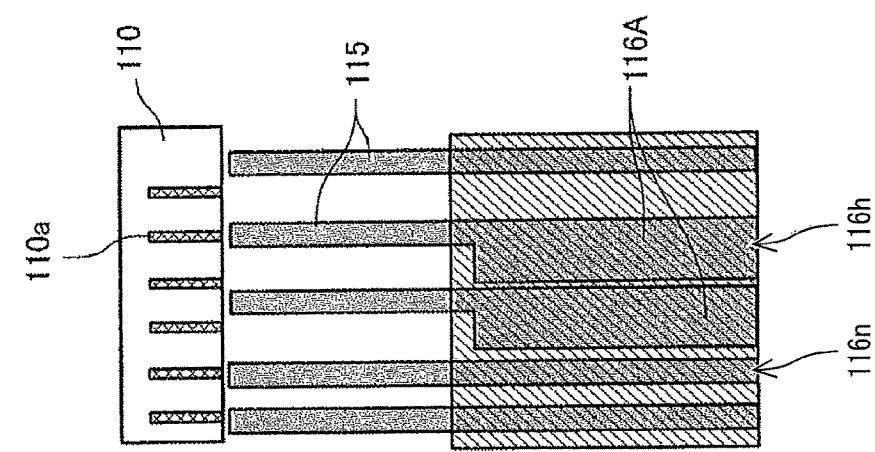
FIG. 17 is a plan view of a main part of the wiring substrate of the sixth embodiment.

FIG. 17 is a plan view of a main part of the wiring substrate of the present embodiment.

In a first wiring substrate 101 in the present embodiment, a plurality of wiring patterns 116 is arranged in the first wiring substrate 101. A protective layer 113 is provided to cover the plurality of wiring patterns 116 and regions between the wiring patterns 116. The first wiring substrate 101 includes a plurality of terminals 115. The terminals 115 communicate with the corresponding wiring patterns 116, respectively, and not covered with the protective layer 113.

The pitch between the adjacent terminals 115 includes at least a first pitch P1 as a reference pitch and a second pitch P2 wider than the first pitch P1.

Here, at least one of the wiring pattern 116h of the wiring patterns 116n and 116h has a portion of expanded width 116A having a width wider than the width of the terminal 115 in the region covered with the protective layer 113. The terminals 115 of the wiring patterns 116n and 116h are adjacent to each other at the second pitch P2. Further, the second pitch P2 is configured to be n times (n is an integer of 2 or more) the first pitch P1.

Figure 15A:
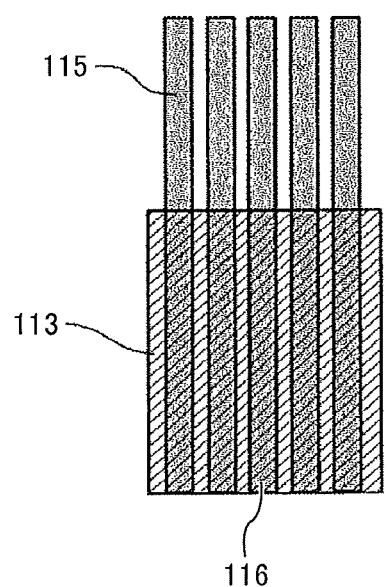
FIGS. 15A and 15B are plan views of a main part of the wiring substrate of Comparative Example 1 used for explaining a wiring substrate according to a sixth embodiment of the present disclosure.
Figure 15B:
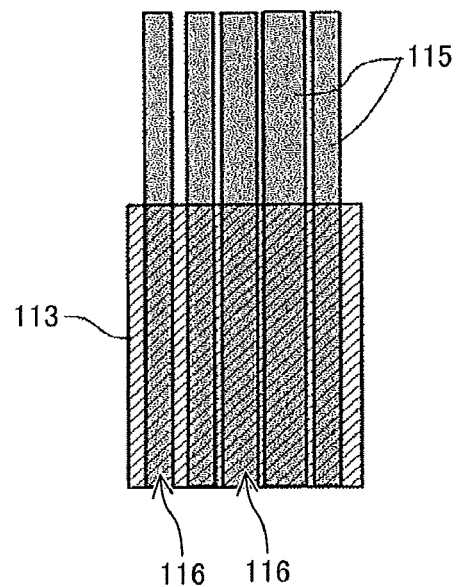

In order to reduce the resistance value of the wiring pattern 116 in FIG. 15A, the width of the wiring pattern 116 including the terminal 115 exposed from the protective layer 113 is widened (thickened). Then, as illustrated in FIG. 15B, spaces between the adjacent terminals 115 become small. If the spaces between the adjacent terminals 115 become small, migration tends to occur, and there is a risk of short-circuiting between the adjacent terminals 115.

Therefore, it is preferable to form the portion of expanded width 116A of the wiring pattern 116 in the region covered with the protective layer 113 as illustrated in FIG. 16. Further, it is preferable to provide a required creepage distance or more between the terminals 115 exposed from the protective layer 113 to separate the terminals 115.

At this time, as illustrated in FIG. 16, if the intervals between the terminals 115 are widened without unification, a position of the terminal 115 may be displaced when the terminals 115 are connected to a probe (or a general-purpose wiring substrate) of a general-purpose inspection apparatus 110 in which the terminals 110a are arranged at equal intervals at a reference pitch of the first wiring substrate 101.

Therefore, in the present embodiment, if the terminals 115 cannot secure the required creepage distance when adjacent terminals 115 are arranged at the first pitch P1 as the reference pitch, the terminals 115 are arranged at a second pitch that is n times (n is an integer of 2 or more) of the reference pitch as illustrated in FIG. 17.

Thereby, even when the terminals 115 are connected to the probes arranged at equal intervals at the reference pitch or connected to the terminals of another wiring substrate, a position displacement of both the terminals of the wiring substrate and the probes does not occur. In other words, present embodiment can secure the necessary creepage distance between the terminals while reducing the resistance value of the wiring pattern. Further, the present embodiment enables the terminals 115 to connect a general-purpose wiring substrate or a general-purpose inspection apparatus.

A seventh embodiment according to the present disclosure is described with reference to FIG. 18.

Figure 18:
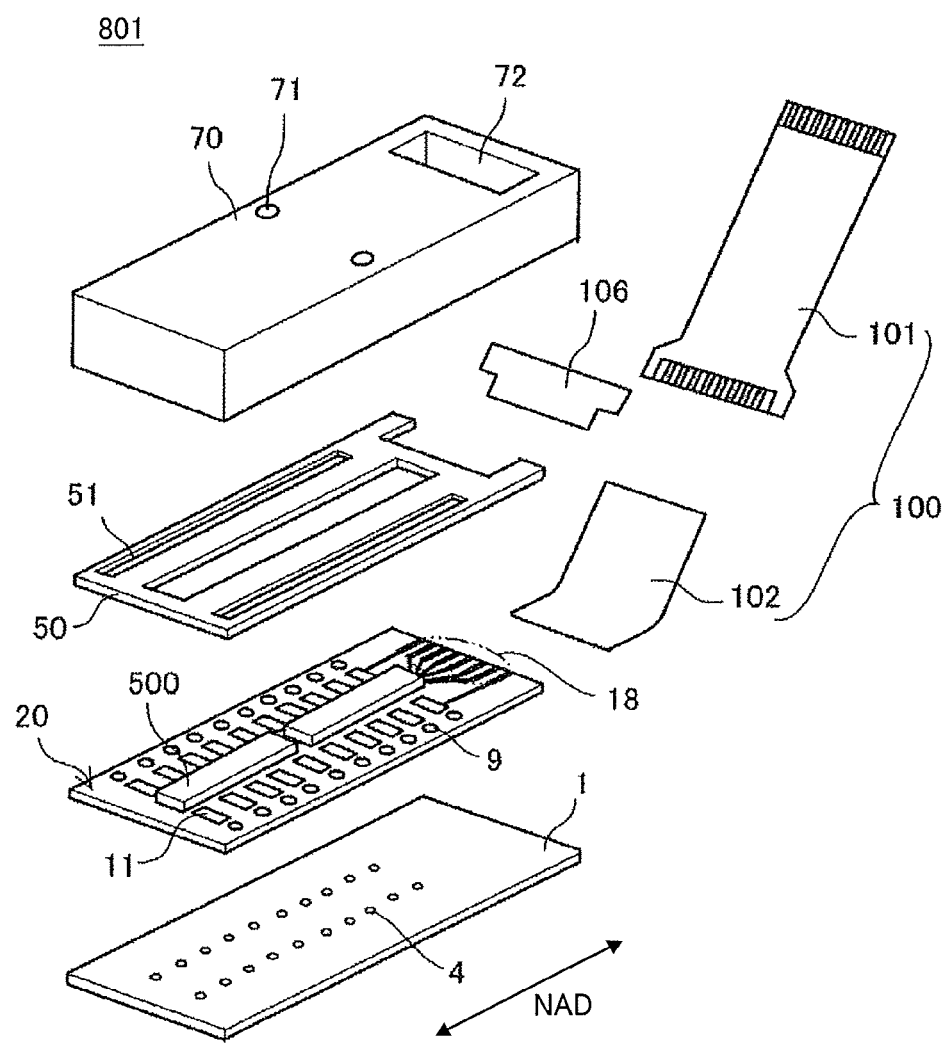
FIG. 18 is an exploded perspective view of an example of a liquid discharge head including a wiring substrate and a wiring member according to a seventh embodiment of the present disclosure.

FIG. 18 is an exploded perspective view of an example of a liquid discharge head 800 including a wiring substrate and a wiring member according to the present embodiment. Hereinafter, the liquid discharge head is simply referred to as "the head".

This liquid discharge head 800 includes a nozzle plate 1 on which nozzles 4 are formed, an actuator substrate 20 including an individual channel and a piezoelectric element 11 as a pressure generator, a holding substrate 50 joined to the actuator substrate 20, and a common-chamber substrate 70 forming a common liquid chamber 10. The common-chamber substrate 70 also serves as a frame of a body 801.

The holding substrate 50 includes openings 51 serves as a part of the common liquid chamber 10. The actuator substrate 20 includes openings 9 communicating with the openings 51 of the holding substrate 50 with individual liquid chambers 6 in the body 801. The common-chamber substrate 70 includes a liquid supply port 71 for supplying the liquid to the opening 51 of the holding substrate 50 from outside the body 801.

The driver integrated circuit (IC) 500 to drive the piezoelectric element 11 is mounted on the actuator substrate 20. Hereinafter, the driver IC 500 is referred to as the driver IC 500. The actuator substrate 20 includes a connection wiring pattern 18 on an end of the actuator substrate 20 in a longitudinal direction of the actuator substrate 20. The connection wiring pattern 18 is connected to the driver IC 500.

Then, the second wiring substrate 102 is connected to this connection wiring pattern 18. The first wiring substrate 101 is connected to the second wiring substrate 102. The first wiring substrate 101 and the second wiring substrate 102 constitute a wiring member 100 according to the present embodiment. A connection portion of the first wiring substrate 101 and the second wiring substrate 102 is covered with a film 106.

An opening 72 is provided at an end in a longitudinal direction of the common-chamber substrate 70 of the body 801. The second wiring substrate 102 connected to the actuator substrate 20 is pulled out through the opening 72.

Figure 19:
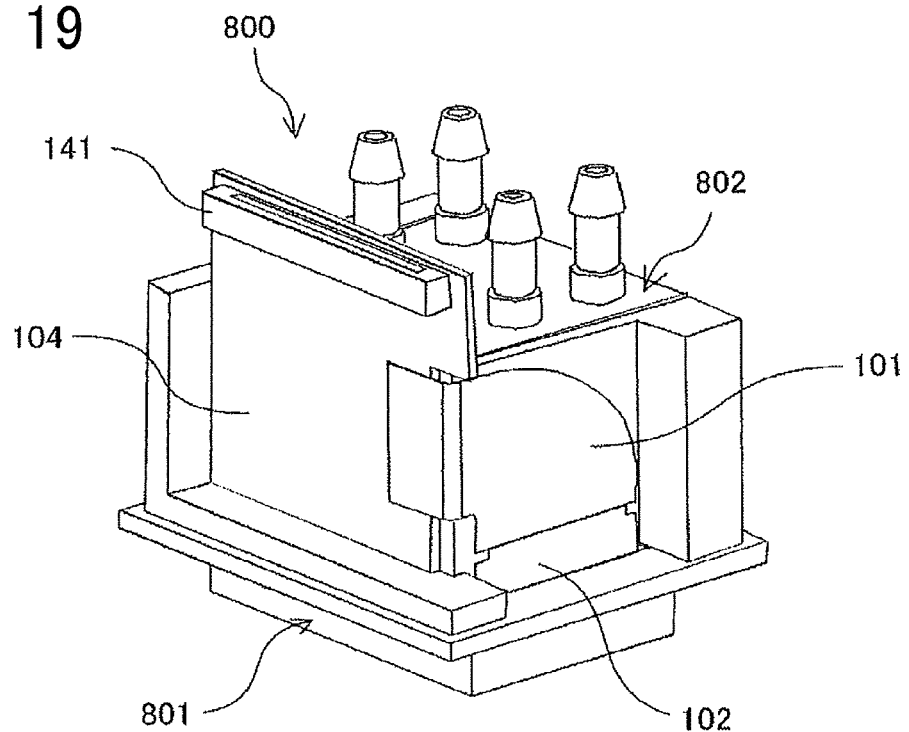
FIG. 19 is a perspective view of a liquid discharge head according to an eighth embodiment of the present disclosure.

FIG. 19 illustrates an eighth embodiment of the head according to the present disclosure. FIG. 19 is a perspective view of the head according to the eighth embodiment.

The head 800 includes a body 801 and a liquid supply member 802. The body 801 includes a nozzle plate 1 in which a plurality of nozzles 4 through which the liquid is discharged is formed. The liquid supply member 802 includes a liquid supply channel communicating with the common liquid chamber 10 inside the body 801 to supply liquid to the body 801.

A printed substrate 104 having a connector 141 to be connected outside the body 801 is arranged along an outer surface of the liquid supply member 802 to stand vertically on the body 801. The second wiring substrate 102 pulled out from the body 801 and the printed substrate 104 are connected by the first wiring substrate 101. The first wiring substrate 101 serves as a bridge wiring member.

Next, an example of a body 801 according to the eighth embodiment is described with reference to FIGS. 20 to 23.

Figure 20:
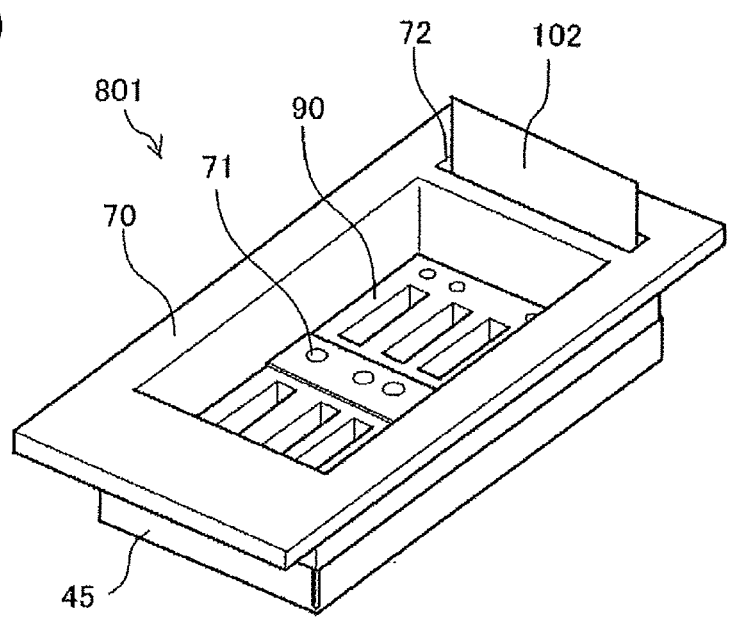
FIG. 20 is a perspective view of an example of a body according to the seventh embodiment of the present disclosure.

FIG. 20 is a perspective view of the body 801.

Figure 21:
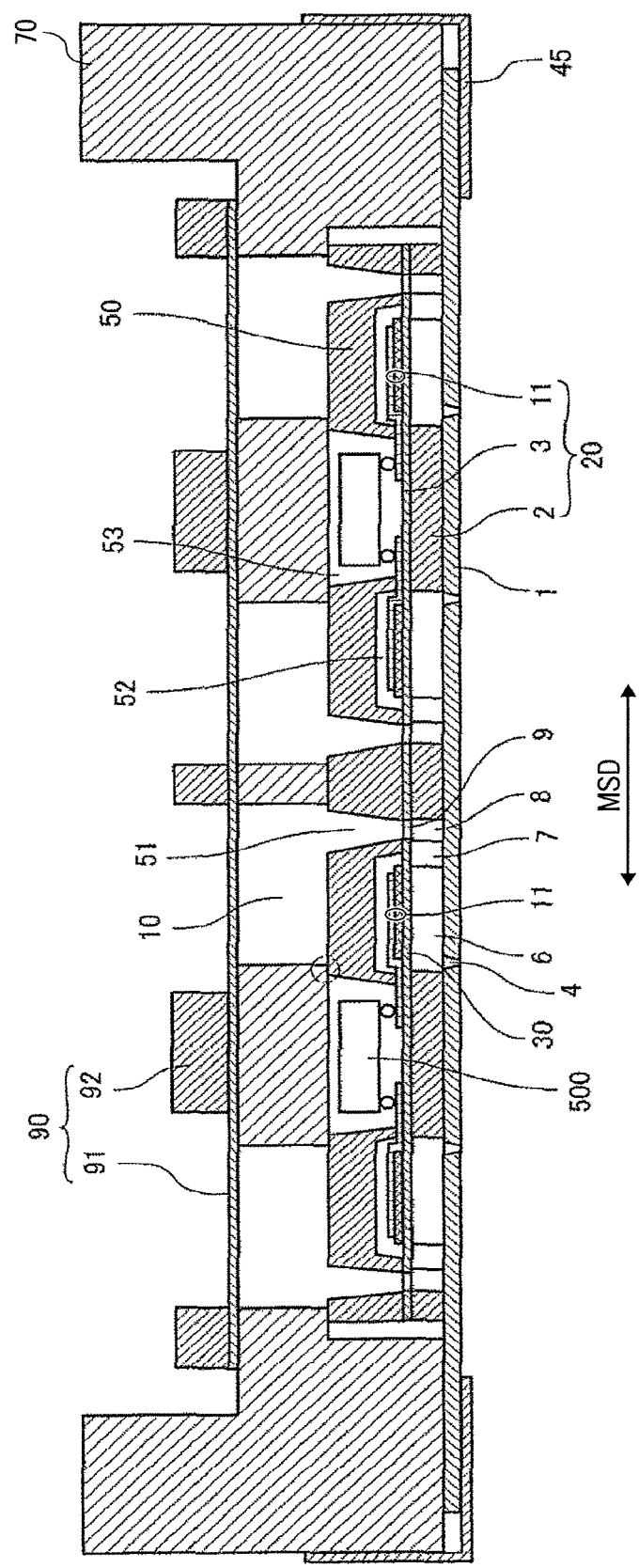
FIG. 21 is a cross-sectional view of the body along a direction perpendicular to a nozzle array direction of the body.

FIG. 21 is a cross-sectional view of the body 801 along the direction perpendicular to a nozzle array direction (NAD) of the body 801.

Figure 22:
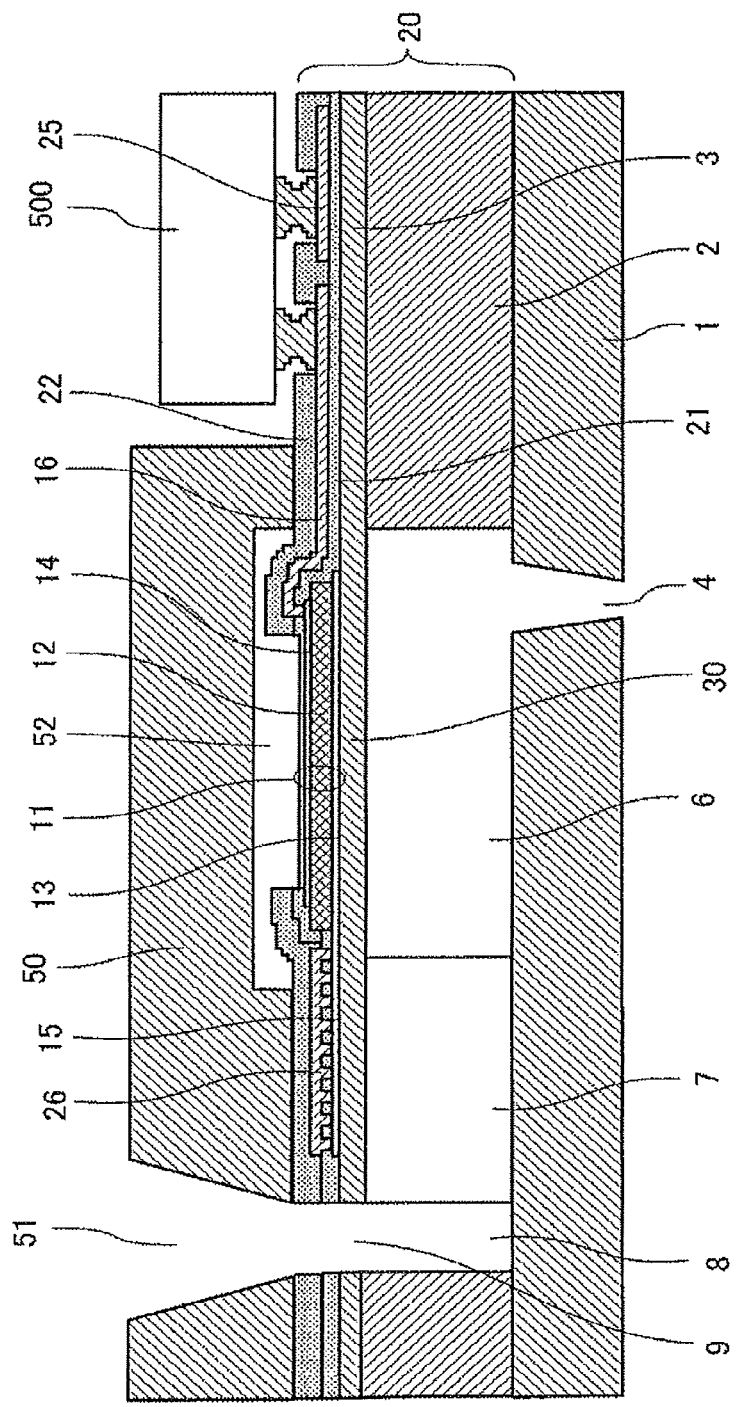

FIG. 22 is an enlarged cross-sectional view of a main portion of the body 801 of FIG. 21.

Figure 23:
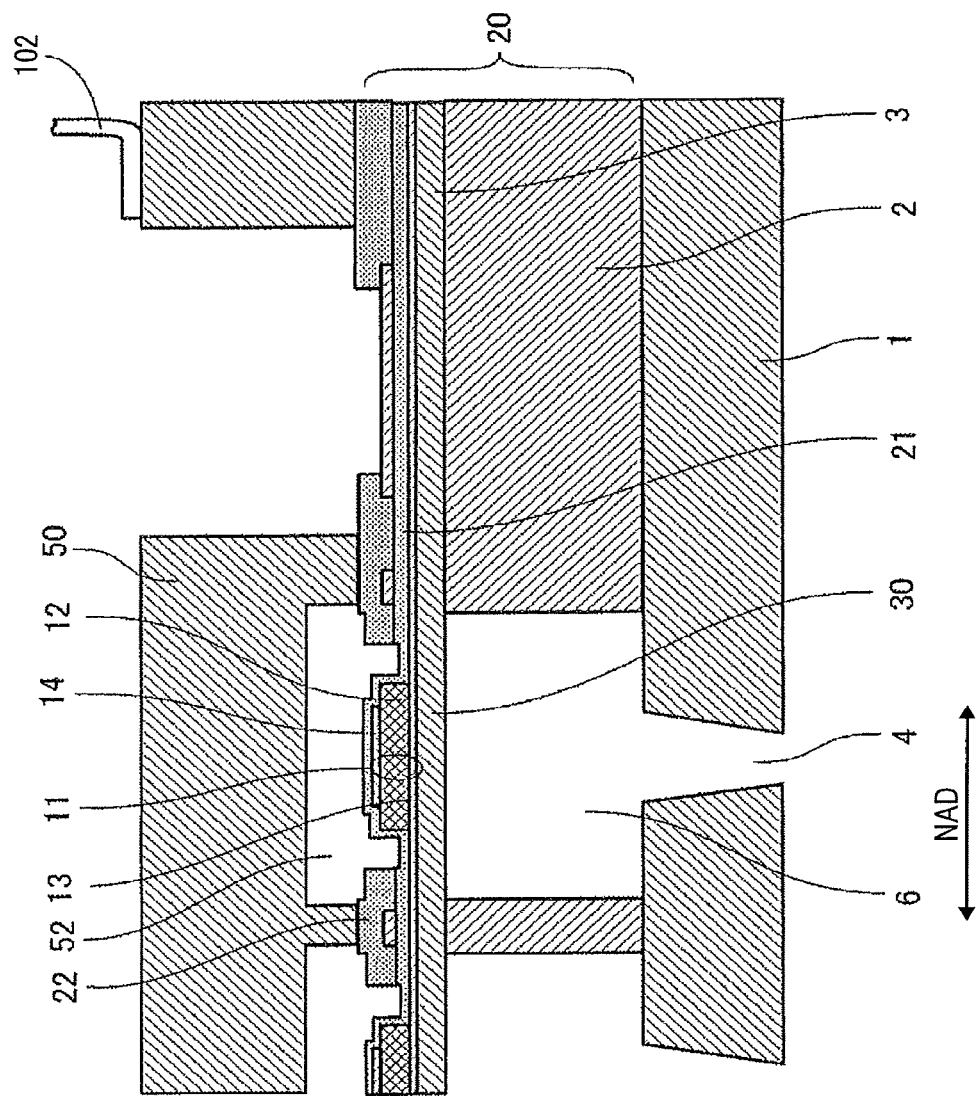
FIG. 23 is a cross-sectional view of a main portion of the body along the nozzle array direction.

FIG. 23 is a cross-sectional view of a main portion of the body 801 along the nozzle array direction (NAD).

The body 801 includes a nozzle plate 1, a channel plate 2, a diaphragm 3, piezoelectric elements 11, a holding substrate 50, a second wiring substrate 102, a common-chamber substrate 70, and a cover 45. The diaphragm 3 forms a wall of an individual liquid chamber 6. The piezoelectric elements 11 serves as a pressure generating elements (pressure generators). The second wiring substrate 102 is a wiring member includes a flexible printed circuit (FPC).

Here, the actuator substrate 20 includes a part constituted by the channel plate 2, the diaphragm 3, and the piezoelectric elements 11.

The nozzle plate 1 includes a plurality of nozzles 4 to discharge liquid. As illustrated in FIG. 21, the nozzles 4 are arrayed in four rows in a main scanning direction (MSD) to form four nozzle arrays. The main scanning direction is perpendicular to the nozzle array direction (NAD).

With the nozzle plate 1 and the diaphragm 3, the channel plate 2 forms individual liquid chambers 6 communicated with the nozzles 4, fluid restrictors 7 communicated with the individual liquid chambers 6, and liquid introduction portions 8 communicated with the fluid restrictors 7.

The liquid introduction portions 8 are communicated with the common liquid chamber 10 formed by the common-chamber substrate 70 via openings 9 of the diaphragm 3 and openings 51 served as a channel of the holding substrate 50.

The diaphragm 3 includes deformable vibration portions 30 forming part of wall of the individual liquid chambers 6. The piezoelectric element 11 is disposed integrally with the vibration portion 30 on a face of the vibration portion 30 of the diaphragm 3 opposite the individual liquid chamber 6. The vibration portion 30 and the piezoelectric element 11 form a piezoelectric actuator.

As illustrated in FIG. 22, the piezoelectric element 11 is constituted by laminating a lower electrode 13, a piezoelectric layer (piezoelectric body) 12, and an upper electrode 14 in this order from the vibration portion 30. An insulation film 21 is formed on the piezoelectric element 11.

The lower electrode 13 as a common electrode for the plurality of piezoelectric elements 11 is connected to a common-electrode power-supply wiring pattern 26 via a common wire 15. The lower electrode 13 is a single electrode layer formed across all of the piezoelectric elements 11 in the nozzle array direction (NAD).

The upper electrodes 14 as individual electrodes for the piezoelectric elements 11 are connected to the driver IC 500 as a drive circuit via individual wires 16. The individual wires 16 are covered with an insulation film 22.

The driver IC 500 is mounted on the actuator substrate 20 by a flip-chip bonding method, for example, to cover an area between rows of the piezoelectric elements 11.

The driver IC 500 mounted on the actuator substrate 20 is connected to an individual-electrode power-supply wiring pattern 25 to which a drive waveform (drive signal) is supplied.

A wiring pattern provided at the second wiring substrate 102 is electrically connected to the driver IC 500. The opposite end of the second wiring substrate 102 is connected to the printed substrate 104 via the first wiring substrate 101 and is further connected to a controller mounted to an apparatus body.

The holding substrate 50 covering the piezoelectric element 11 on the actuator substrate 20. The holding substrate 50 is bonded, with adhesive, to one side of the actuator substrate 20 on which the diaphragm 3 is disposed.

The holding substrate 50 includes openings 51, recesses 52, and openings 53. The openings 51 serve as a part of a channel that communicates the common liquid chambers 10 with the individual liquid chambers 6. The recesses 52 accommodate the piezoelectric elements 11. The openings 53 accommodate the driver IC 500. As illustrated in FIG. 18, the openings 51 are slit-shaped through holes extending along the nozzle array direction (NAD) and form a part of the common liquid chamber 10.

The holding substrate 50 is interposed between the actuator substrate 20 and the common-chamber substrate 70 to form a part of a wall of the common liquid chamber 10.

The common-chamber substrate 70 forms the common liquid chamber 10 that supplies the liquid to each of the individual liquid chambers 6. As illustrated in FIG. 21, four common liquid chambers 10 are disposed corresponding to four nozzle rows. A plurality of nozzles 4 is arrayed in the nozzle array direction (NAD) in each nozzle rows. Desired colors of liquids are supplied to the respective common liquid chambers 10 via the liquid supply port 71 communicating with the liquid supply member 802.

A damper unit 90 is bonded to the common-chamber substrate 70. The damper unit 90 includes a damper 91 and damper plates 92. The damper 91 is deformable and forms part of wall of the common liquid chamber 10. The damper plates 92 reinforce the damper 91.

The common-chamber substrate 70 is bonded to the holding substrate 50 and an outer peripheral portion of the nozzle plate 1 with adhesive. The common-chamber substrate 70 accommodates the actuator substrate 20 and the holding substrate 50, thus forming a frame of the head 800.

The cover 45 covers a part of a peripheral portion of the nozzle plate 1 and part of outer circumferential face of the common-chamber substrate 70.

In this body 801 of the head 800, voltage is applied from the driver IC 500 to a portion between the upper electrode 14 and the lower electrode 13 of the piezoelectric element 11. Accordingly, the piezoelectric layer 12 expands in an electrode lamination direction (in other words, an electric-field direction) in which the upper electrode 14 and the lower electrode 13 are laminated, and contracts in a direction parallel to the vibration portion 30.

Thus, tensile stress arises at the lower electrode 13 side of the vibration portion 30 facing the lower electrode 13. This tensile stress causes the vibration portion 30 to bend toward an individual liquid chamber 6 side of the vibration portion 30 facing the individual liquid chamber 6. Accordingly, liquid within the individual liquid chamber 6 is pressurized and discharged from the nozzle 4.

Figure 24:
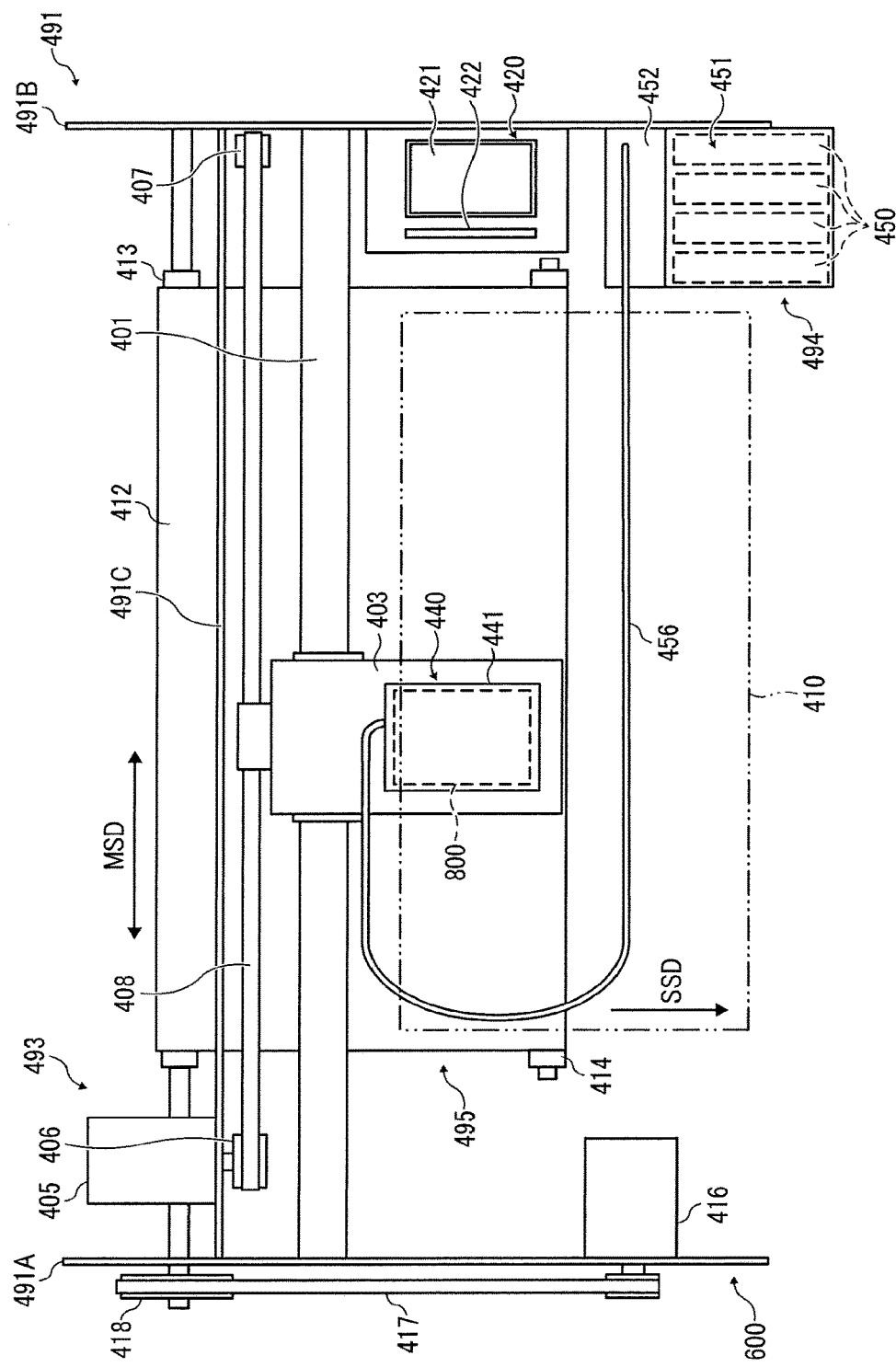
FIG. 24 is a plan view of a main part of a liquid discharge apparatus according to an embodiment of the present disclosure.
Figure 25:
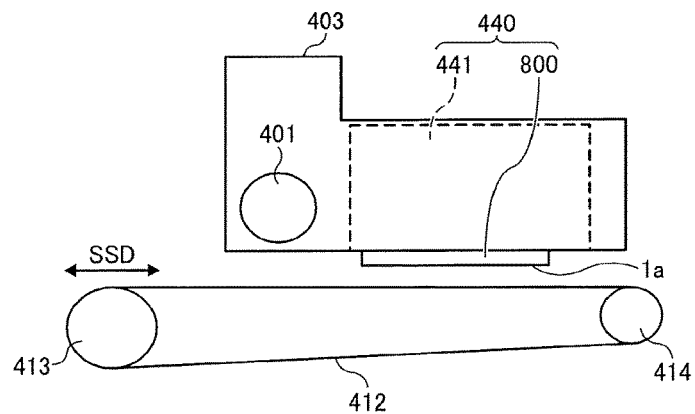
FIG. 25 is a side view of a main part of the liquid discharge apparatus.

FIGS. 24 and 25 illustrate an example of a liquid discharge apparatus 600 according to the present embodiment. FIG. 24 is a plan view of a main part of the liquid discharge apparatus 600. FIG. 25 is a side view of a main part of the liquid discharge apparatus 600.

The liquid discharge apparatus 600 is a serial-type apparatus in which a drive unit 493 reciprocally moves a carriage 403 in a main scanning direction (MSD) indicated by an arrow in FIG. 24. The drive unit 493 includes a guide 401, a main scanning motor 405, a timing belt 408, etc. The guide 401 is laterally bridged between a left side plate 491A and a right side plate 491B and supports the carriage 403 so that the carriage 403 is movable along the guide 401. The main scanning motor 405 reciprocally moves the carriage 403 in the main scanning direction MSD via the timing belt 408 laterally bridged between a drive pulley 406 and a driven pulley 407.

The carriage 403 mounts a liquid discharge device 440 in which the head 800 according to the present embodiment and a head tank 441 are integrated as a single unit. The head 800 of the liquid discharge device 440 discharges color liquids of, for example, yellow (Y), cyan (C), magenta (M), and black (K).

The head 800 includes nozzle rows each including a plurality of nozzles 4 arrayed in a sub-scanning direction (SSD). The sub-scanning direction (SSD) is along the nozzle array direction (NAD). The sub-scanning direction (SSD) is perpendicular to the main scanning direction (MSD). The head 800 is mounted to the carriage 403 so that ink droplets are discharged downward.

The liquid stored outside the head 800 is supplied to the head 800 via a supply unit 494 that supplies the liquid from a liquid cartridge 450 to the head tank 441.

The supply unit 494 includes, e.g., a cartridge holder 451 as a mount part to mount a liquid cartridge 450, a tube 456, and a liquid feed unit 452 including a liquid feed pump. The liquid cartridge 450 is detachably attached to the cartridge holder 451. The liquid is supplied to the head tank 441 by the liquid feed unit 452 via the tube 456 from the liquid cartridge 450.

The liquid discharge apparatus 600 includes a conveyance unit 495 to convey a sheet 410. The conveyance unit 495 includes a conveyance belt 412 as a conveyor and a sub-scanning motor 416 to drive the conveyance belt 412.

The conveyance belt 412 attracts the sheet 410 and conveys the sheet 410 at a position facing the head 800. The conveyance belt 412 is in the form of an endless belt. The conveyance belt 412 is stretched between a conveyance roller 413 and a tension roller 414. The sheet 410 is attracted to the conveyance belt 412 by electrostatic force or air suction.

The conveyance roller 413 is rotated by a sub-scanning motor 416 via a timing belt 417 and a timing pulley 418, so that the conveyance belt 412 circulates in a sub-scanning direction indicated by arrow SSD in FIGS. 24 and 25.

At one side in the main scanning direction (MSD) of the carriage 403, a maintenance unit 420 to recover the head 800 in good condition is disposed on a lateral side (right-hand side) of the conveyance belt 412 in FIG. 24.

The maintenance unit 420 includes, for example, a cap 421 to cap a nozzle face (i.e., a face on which the nozzles 4 are formed) 1a of the head 800 and a wiper 422 to wipe the nozzle face 1a.

The drive unit 493, the supply unit 494, the maintenance unit 420, and the conveyance unit 495 are mounted to a housing 491 that includes the left side plate 491A, the right side plate 491B, and a rear side plate 491C.

In the liquid discharge apparatus 600 thus configured, a sheet 410 is conveyed on and attracted to the conveyance belt 412 and is conveyed in the sub-scanning direction SSD by the cyclic rotation of the conveyance belt 412.

The head 800 is driven in response to image signals while the carriage 403 moves in the main scanning direction MSD, to discharge liquid onto the sheet 410 stopped, thus forming an image on the sheet 410.

As described above, the liquid discharge apparatus 600 includes the head 800 according to the present embodiment, thus allowing stable formation of high quality images.

Figure 26:
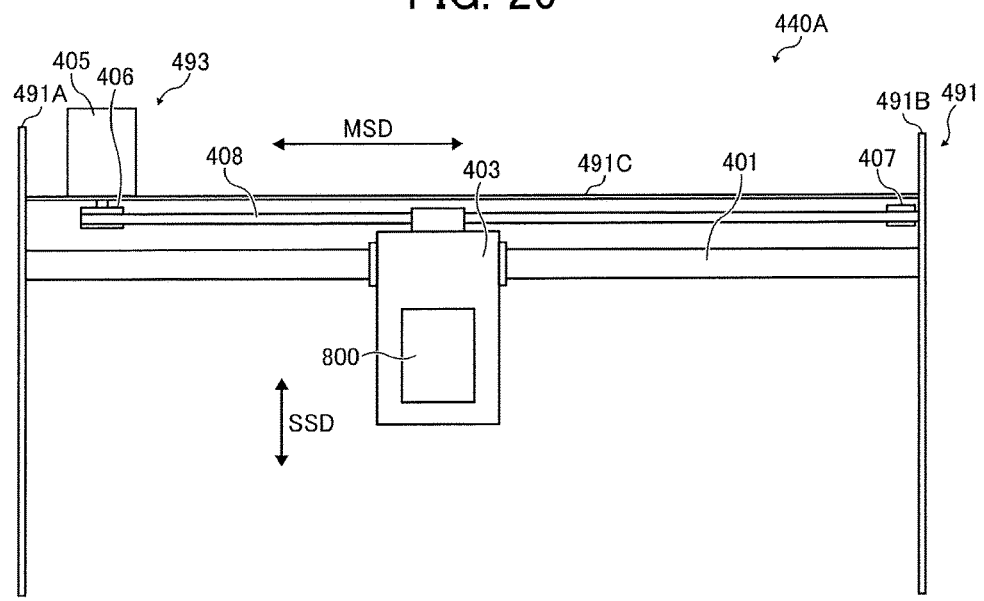
FIG. 26 is a plan view of an example of a main part of a liquid discharge device.

FIG. 26 illustrates another example of the liquid discharge device 440A according to another embodiment of the present disclosure. FIG. 26 is a plan view of a main part of the liquid discharge device 440A.

The liquid discharge device 440A includes the housing 491, the drive unit 493, the carriage 403, and the head 800 among components of the liquid discharge apparatus 600. The left side plate 491A, the right side plate 491B, and the rear side plate 491C constitute the housing 491.

Note that, in the liquid discharge device 440A, at least one of the maintenance unit 420 and the supply unit 494 described above may be mounted on, for example, the right side plate 491B.

Figure 27:
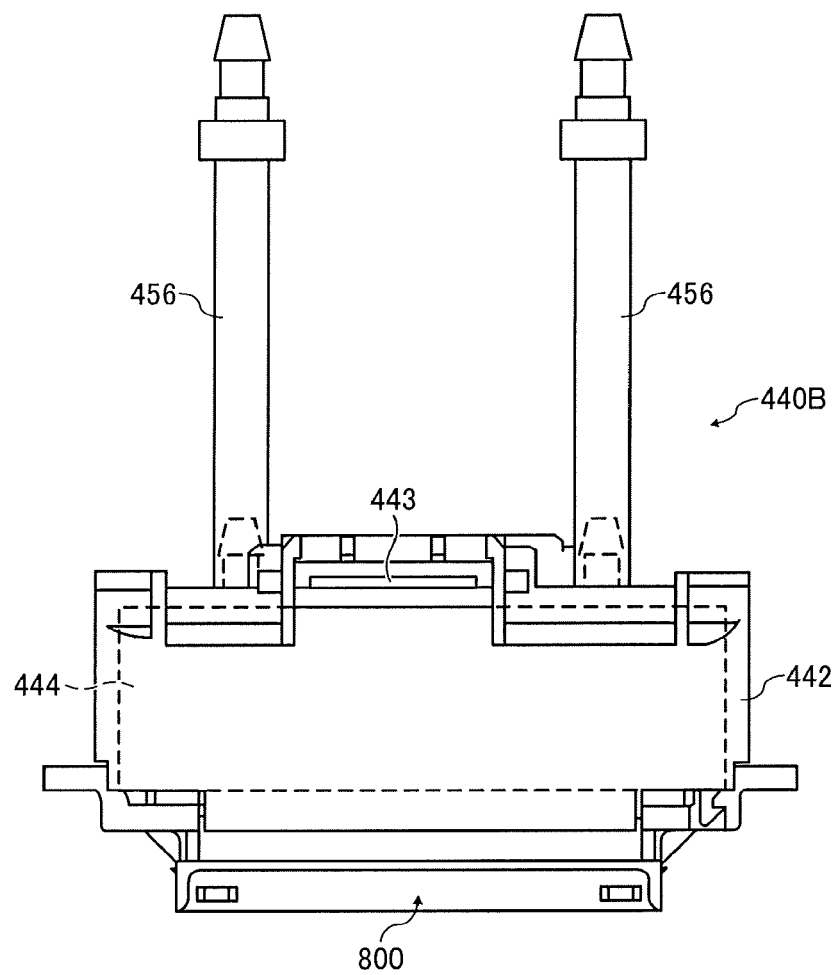
FIG. 27 is a front view of still another example of the liquid discharge device.

FIG. 27 illustrates still another example of the liquid discharge device 440B according to the present embodiment. FIG. 27 is a front view of the liquid discharge device 440B.

The liquid discharge device 440B includes the head 800 to which a channel part 444 is mounted and a tube 456 connected to the channel part 444. The channel part 444 serves as the liquid supply member.

Further, the channel part 444 is disposed inside a cover 442. Instead of the channel part 444, the liquid discharge device 440B may include the head tank 441. A connector 443 to electrically connect the head 800 to a power source is disposed above the channel part 444.

In the present disclosure, discharged liquid is not limited to a particular liquid as long as the liquid has a viscosity or surface tension to be discharged from a head. However, preferably, the viscosity of the liquid is not greater than 30 mPa·s under ordinary temperature and ordinary pressure or by heating or cooling.

Examples of the liquid include a solution, a suspension, or an emulsion including, for example, a solvent, such as water or an organic solvent, a colorant, such as dye or pigment, a functional material, such as a polymerizable compound, a resin, or a surfactant, a biocompatible material, such as DNA, amino acid, protein, or calcium, and an edible material, such as a natural colorant.

Such a solution, a suspension, or an emulsion can be used for, e.g., inkjet ink, surface treatment solution, a liquid for forming components of electronic element or light-emitting element or a resist pattern of electronic circuit, or a material solution for three-dimensional fabrication.

Examples of an energy source for generating energy to discharge liquid include a piezoelectric actuator (a laminated piezoelectric element or a thin-film piezoelectric element), a thermal actuator that employs a thermoelectric conversion element, such as a heating resistor (element), and an electrostatic actuator including a diaphragm and opposed electrodes.

"The liquid discharge device" is an integrated unit including the head and a functional part(s) or unit(s), and is an assembly of parts relating to liquid discharge. For example, "the liquid discharge device" may be a combination of the head with at least one of a head tank, a carriage, a supply unit, a maintenance unit, and a drive unit.

Herein, the terms "integrated" or "united" mean fixing the head and the functional parts (or mechanism) to each other by fastening, screwing, binding, or engaging and holding one of the head and the functional parts movably relative to the other. The head may be detachably attached to the functional part(s) or unit(s) each other.

For example, the head and a head tank are integrated as the liquid discharge device. The head and the head tank may be connected each other via, e.g., a tube to integrally form the liquid discharge device. Here, a unit including a filter may further be added to a portion between the head tank and the head of the liquid discharge device.

The liquid discharge device may be an integrated unit in which a head is integrated with a carriage.

The liquid discharge device may be the head movably held by a guide that forms part of a drive unit, so that the head and the drive unit are integrated as a single unit. The liquid discharge device may include the head, the carriage, and the drive unit that are integrated as a single unit.

In another example, the cap that forms part of the maintenance unit is secured to the carriage mounting the head so that the head, the carriage, and the maintenance unit are integrated as a single unit to form the liquid discharge device.

Further, the liquid discharge device may include tubes connected to the head mounted on the head tank or the channel member so that the head and the supply unit are integrated as a single unit. Liquid is supplied from a liquid reservoir source such as liquid cartridge to the head through the tube.

The drive unit may be a guide only. The supply unit may be a tube(s) only or a mount part (loading unit) only.

The term "liquid discharge apparatus" used herein also represents an apparatus including the head or the liquid discharge device to discharge liquid by driving the head. The liquid discharge apparatus may be, for example, an apparatus capable of discharging liquid onto a material to which liquid can adhere or an apparatus to discharge liquid toward gas or into liquid.

The "liquid discharge apparatus" may include devices to feed, convey, and eject the material on which liquid can adhere. The liquid discharge apparatus may further include a pretreatment apparatus to coat a treatment liquid onto the material, and a post-treatment apparatus to coat a treatment liquid onto the material, on which the liquid has been discharged.

The "liquid discharge apparatus" may be, for example, an image forming apparatus to form an image on a sheet by discharging ink, or a three-dimensional fabricating apparatus to discharge a fabrication liquid onto a powder layer in which powder material is formed in layers, so as to form a three-dimensional fabrication object.

In addition, "the liquid discharge apparatus" is not limited to such an apparatus to form and visualize meaningful images, such as letters or figures, with discharged liquid. For example, the liquid discharge apparatus may be an apparatus to form meaningless images, such as meaningless patterns, or fabricate three-dimensional images.

The above-described term "material on which liquid can be adhered" represents a material on which liquid is at least temporarily adhered, a material on which liquid is adhered and fixed, or a material into which liquid is adhered to permeate.

Examples of the "medium on which liquid can be adhered" include recording media, such as paper sheet, recording paper, recording sheet of paper, film, and cloth, electronic component, such as electronic substrate and piezoelectric element, and media, such as powder layer, organ model, and testing cell. The "medium on which liquid can be adhered" includes any medium on which liquid is adhered, unless particularly limited.

Examples of "the material on which liquid can be adhered" include any materials on which liquid can be adhered even temporarily, such as paper, thread, fiber, fabric, leather, metal, plastic, glass, wood, and ceramic.

"The liquid discharge apparatus" may be an apparatus to relatively move a head and a medium on which liquid can be adhered. However, the liquid discharge apparatus is not limited to such an apparatus. For example, the liquid discharge apparatus may be a serial head apparatus that moves the head or a line head apparatus that does not move the head.

Examples of "the liquid discharge apparatus" further include a treatment liquid coating apparatus to discharge a treatment liquid onto a sheet surface to coat the sheet surface with the treatment liquid to reform the sheet surface and an injection granulation apparatus to eject a composition liquid including a raw material dispersed in a solution from a nozzle to mold particles of the raw material.

The terms "image formation", "recording", "printing", "image printing", and "fabricating" used herein may be used synonymously with each other.

Numerous additional modifications and variations are possible in light of the above teachings. It is therefore to be understood that, within the scope of the above teachings, the present disclosure may be practiced otherwise than as specifically described herein. With some embodiments having thus been described, it is obvious that the same may be varied in many ways. Such variations are not to be regarded as a departure from the scope of the present disclosure and appended claims, and all such modifications are intended to be included within the scope of the present disclosure and appended claims.

What is claimed is:

1. A wiring substrate comprising:
a plurality of wiring patterns;
a protective layer to cover the plurality of wiring patterns and regions between the plurality of wiring patterns; and
a plurality of terminals communicating with the plurality of wiring patterns, the plurality of terminals not covered by the protective layer,
wherein pitch between the plurality of terminals adjacent to each other includes a first pitch and a second pitch wider than the first pitch,
at least one of the plurality of wiring patterns, the plurality of terminals of which are adjacent to each other at the second pitch, includes a portion of expanded width having a width wider than a width of the plurality of terminals,
the portion of expanded width is covered with the protective layer, and
an interval between the portion of expanded width of the at least one of the plurality of wiring patterns and another wiring pattern adjacent to the portion of expanded width is narrower than an interval between the plurality of terminals adjacent to each other at the second pitch.

2. The wiring substrate according to claim 1, wherein the second pitch is n times wider than the first pitch,
where n is an integer of 2 or more.

3. The wiring substrate according to claim 1, wherein a potential difference between the plurality of terminals adjacent to each other at the second pitch is greater than a potential difference between the plurality of terminals adjacent each other at the first pitch.

4. The wiring substrate according to claim 1, wherein the plurality of terminals includes two or more terminals adjacent to each other at the first pitch and communicating with an identical one of the plurality of wiring patterns.

5. The wiring substrate according to claim 1, wherein the interval between the portion of expanded width of the at least one of the plurality of wiring patterns and the another wiring pattern is narrower than the first pitch.

6. A wiring member comprising:
a first wiring substrate according to the wiring substrate in claim 1; and
a second wiring substrate on which a plurality of second terminals are disposed,
wherein the first wiring substrate and the second wiring substrate are electrically connected to each other,
the second wiring substrate includes a dummy terminal disposed between the plurality of terminals adjacent to each other at the second pitch on the first wiring substrate, and
an interval between the dummy terminal and the plurality of second terminals adjacent to the dummy terminal is at the first pitch.

7. The wiring member according to claim 6, wherein the second wiring substrate includes a plurality of dummy terminals electrically connected to each other.

8. A liquid discharge head comprising:
a body including a nozzle face in which a plurality of nozzles is formed to discharge liquid; and
the wiring member according to claim 1 connected to the body.

9. A liquid discharge device comprising the liquid discharge head according to claim 8.

10. The liquid discharge device according to claim 9, further comprising at least one of:
- a head tank to store the liquid to be supplied to the liquid discharge head;
- a carriage to mount the liquid discharge head;
- a supply unit to supply the liquid to the liquid discharge head;
- a maintenance unit to maintain the liquid discharge head; and
- a drive unit to move the carriage in a main scanning direction, to be integrated with the liquid discharge head as a single unit.

11. A liquid discharge apparatus comprising the liquid discharge device according to claim 9.

* * * * *